(12) United States Patent
Nakajima et al.

(10) Patent No.: US 8,766,325 B2
(45) Date of Patent: Jul. 1, 2014

(54) SEMICONDUCTOR DEVICE

(71) Applicant: Rohm Co., Ltd., Kyoto (JP)

(72) Inventors: Toshio Nakajima, Kyoto (JP); Syoji Higashida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/750,042

(22) Filed: Jan. 25, 2013

(65) Prior Publication Data
US 2013/0134478 A1 May 30, 2013

Related U.S. Application Data

(63) Continuation-in-part of application No. PCT/JP2012/076482, filed on Oct. 12, 2012.

(30) Foreign Application Priority Data

Oct. 17, 2011 (JP) ................................ 2011-227966
Jan. 26, 2012 (JP) ................................ 2012-014415

(51) Int. Cl.
*H01L 23/58* (2006.01)

(52) U.S. Cl.
USPC ........... 257/212; 257/133; 257/220; 257/242; 257/332; 438/133; 438/135; 438/269; 438/271

(58) Field of Classification Search
USPC ......... 257/133, 212, 220, 242, 262–263, 302, 257/328, 330, 332.368; 438/133, 135, 138, 438/268–271
See application file for complete search history.

(56) References Cited

U.S. PATENT DOCUMENTS 5,273,917 A 12/1993 Sakurai
5,801,408 A * 9/1998 Takahashi ..................... 257/212

FOREIGN PATENT DOCUMENTS

JP H3-155677 A 7/1991

* cited by examiner

*Primary Examiner* — Dung A. Le
(74) *Attorney, Agent, or Firm* — Chen Yoshimura LLP

(57) ABSTRACT

A semiconductor device includes: an $n^-$-type base layer; a p-type base layer formed in a part of a front surface portion of the $n^-$-type base layer; an $n^+$-type source layer formed in a part of a front surface portion of the p-type base layer; a gate insulating film formed on the front surface of the p-type base layer between the $n^+$-type source layer and the $n^-$-type base layer; a gate electrode that faces the p-type base layer through the gate insulating film; a p-type column layer formed continuously from the p-type base layer in the $n^-$-type base layer; a $p^+$-type collector layer formed in a part of a rear surface portion of the $n^-$-type base layer; a source electrode electrically connected to the $n^+$-type source layer; and a drain electrode electrically connected to the $n^-$-type base layer and to the $p^+$-type collector layer.

28 Claims, 33 Drawing Sheets

Grinding

P+ Implantation (1) : B+ 100keV 7° 1e16cm$^{-2}$

P+ Implantation (2) : BF2+ 30keV 7° 1e16cm$^{-2}$

SEMICONDUCTOR DEVICE

This application is a continuation-in-part of PCT International Application No. PCT/JP2012/076482 designating the United States, filed on Oct. 12, 2012, which claims the benefit of Japanese Application No. 2011-227966, filed in Japan on Oct. 17, 2011. Both applications are hereby incorporated by reference in their entireties.

The present application also claims the benefit of Japanese Application No. 2012-014415, filed in Japan on Jan. 26, 2012, which is hereby incorporated by reference in its entirety.

BACKGROUND OF THE INVENTION

1. Field of the Invention

The present invention relates to a semiconductor device having a super-junction structure and a method of manufacturing the same.

2. Description of Related Art

IGBTs (insulated-gate bipolar transistors) and a conductivity modulation type MOSFET disclosed in Patent Document 1, for example, are known as switching elements that are used in an inverter circuit or a power circuit that is provided in home appliances such as refrigerators, air-conditioners, and washing machines, energy-related systems such as solar energy generating systems and wind power generating systems, and automobiles such as electric vehicles (EV) and hybrid electric vehicles (HEV).

The conductivity modulation type MOSFET in Patent Document 1 includes: a $p^+$ collector region; an $n^-$ high resistance region that makes contact with the $p^+$ collector region; a p-base region formed in a part of a front surface portion of then high resistance region; two $n^+$ source regions formed in a front surface portion of the p-base region; a $p^+$ well region formed between the two $n^+$ source regions; a gate electrode provided on an insulating film to form a channel in the p-type base region surrounded by the $n^+$ source regions and then high resistance region; an n-region formed on the rear surface of the $n^-$ high resistance region so as to have a higher concentration than that of the $n^-$ high resistance region; and a schottky barrier metal film formed on the n-region.

RELATED ART DOCUMENT

Patent Document

Patent Document 1: Japanese Patent Application Laid-Open Publication No. H3-155677

SUMMARY OF THE INVENTION

In the appliances mentioned above as examples, a reduction in power consumption is required for all built-in applications to reduce the environmental impact.

However, IGBTs as switching elements are bipolar devices, unlike MOSFETs, and therefore require an ON voltage that is greater than VF (forward voltage) for a current to rise. This results in a problem of low efficiency in low current operations when used in a driver circuit for a motor, for example.

On the other hand, because MOSFETs are mono-polar devices that have a higher efficiency in low current operations than that of IGBTs, MOSFETs can be used to replace IGBTs. However, in order to achieve MOSFETs that can be used in high current operations in addition to low current operations, the chip size of the MOSFETs needs to be larger, which causes an increase in cost.

An object of the present invention is to provide a semiconductor device that can achieve optimum device characteristics for a desired application by having an MOSFET that can reduce an ON resistance in low current operations and that can perform conductivity modulation in high current operations, and to provide a manufacturing method thereof.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, a semiconductor device of the present invention includes: a first conductive type base layer; a second conductive type base layer formed in a part of a front surface portion of the first conductive type base layer; a first conductive type source layer formed in a part of a front surface portion of the second conductive type base layer; a gate insulating film formed on a front surface of the second conductive type base layer located between the first conductive type source layer and the first conductive type base layer; a gate electrode formed on the gate insulating film so as to face, through the gate insulating film, the second conductive type base layer located between the first conductive type source layer and the first conductive type base layer; a second conductive type column layer formed in the first conductive type base layer continuously from the second conductive type base layer, the second conductive type column layer extending from the second conductive type base layer toward a rear surface of the first conducive type base layer; a second conductive type collector layer formed in a part of a rear surface portion of the first conductive type base layer; a source electrode electrically connected to the first conductive type source layer; and a drain electrode formed so as to make contact with the rear surface of the first conductive type base layer, the drain electrode being electrically connected to the first conductive type base layer and the second conductive type collector layer.

With this configuration, the second conductive type column layer formed continuously from the second conductive type base layer is extended toward the rear surface of the first conductive type base layer, thereby realizing a super-junction MOSFET. When the drain electrode is applied with a potential higher than that of the source electrode, and when a control voltage greater than the threshold voltage is applied to the gate electrode, an inversion layer (channel) is formed near the front surface of the second conductive type base layer. As a result, a current path is formed from the drain electrode to the source electrode through the first conductive type base layer, the inversion layer near the front surface of the second conductive type base layer, and the first conductive type source layer.

With the super-junction structure, the depletion layer can be expanded in the direction along the boundary between the second conductive type column layer and the first conductive type base layer (that is, the thickness direction of the first conductive type base layer). As a result, it is possible to prevent electric fields from being concentrated in a localized area of the first conductive type base layer, thereby achieving a semiconductor device having a lower ON resistance and a higher breakdown voltage.

Further, in this semiconductor device, the first conductive type base layer receives electrons or holes from the second conductive type collector layer that is formed in a part of the rear surface portion of the first conductive type base layer, which allows the conductivity modulation to occur in the first conductive type base layer. As a result, in high current operations, the current can be raised in a manner similar to a current waveform of an IGBT.

That is, the semiconductor device of the present invention is equipped with an MOSFET that can reduce the ON resistance in low current operations and that can perform conductivity modulation in high current operations, allowing optimum device characteristics for desired applications.

It is preferable that the first conductive type base layer include, in the rear surface portion thereof, a first conductive type contact layer that has a higher impurity concentration than other portions of the first conductive type base layer.

With this configuration, it is possible to obtain an excellent ohmic contact between the first conductive type base layer and the drain electrode.

When the first conductive type base layer includes: a drift layer that has a relatively low impurity concentration, and a substrate that has a higher impurity concentration than that of the drift layer and that supports the drift layer, the substrate may serve as the first conductive type contact layer.

In the semiconductor device of the present invention, when the first conductive type contact layer is formed in the entire rear surface portion of the first conductive type base layer, it is preferable that the second conductive type collector layer be formed so as to penetrate the first conductive type contact layer in a thickness direction.

In the semiconductor device of the present invention, it is preferable that the thickness of the first conductive type base layer between the rear surface thereof and a lower end of the second conductive type column layer be 15 µm or greater.

This makes it possible to ensure a breakdown voltage of 600V or higher.

In the semiconductor device of the present invention, it is preferable that the second conductive type collector layer have a width of more than 6 µm and 16 µm or less.

This makes it possible to achieve ohmic characteristics in low current operations and desired conductivity modulation in high current operations.

In the semiconductor device of the present invention, it is preferable that a depth of the second conductive type collector layer from the rear surface of the first conductive type base layer be 0.2 µm to 3.0 µm. Also, it is preferable that an impurity concentration of the second conductive type collector layer be $1\times10^{17}$ cm$^{-3}$ to $1\times10^{22}$ cm$^{-3}$.

In the semiconductor device of the present invention, the second conductive type collector layer may be disposed along the rear surface of the first conductive type base layer so as not to be directly below the second conductive type column layer. In this case, it is preferable that the second conductive type collector layer be located directly below the gate electrode. Alternatively, the second conductive type collector layer may be located directly below the second conductive type column layer.

In the semiconductor device of the present invention, a plurality of second conductive type column layers, each of which is formed in a columnar shape, may be arranged in a staggered pattern. In this case, the respective second conductive type column layers may have a square column shape, or may have a hexagon column shape.

Alternatively, in the semiconductor device of the present invention, a plurality of second conductive type column layers, each of which is formed in a strip, may be arranged in a stripe pattern.

The semiconductor device of the present invention may have a planar gate structure in which the gate insulating film is formed so as to cover the front surface of the first conductive type base layer, and the gate electrode is formed on the gate insulating film, or may have a trench gate structure in which a gate trench is formed in a front surface portion of the first conductive type base layer so as to penetrate the first conductive type source layer and the second conductive type base layer, and the gate electrode is formed to fill the gate trench through the gate insulating film.

The second conductive type collector layer may have a tapered shape that becomes narrower in a direction from the front surface of the first conductive type base layer toward the rear surface thereof.

The impurity concentration of the second conductive type collector layer may be uniform in one or both of the directions along and orthogonal to the rear surface of the first conductive type base layer, or may vary in one or both of the directions along and orthogonal to the rear surface of the first conductive type base layer.

In the semiconductor device of the present invention, it is preferable that the first conductive type base layer be provided with a depletion layer stopper region that includes first heavy particles, which were turned into donors, between the second conductive type column layer and the second conductive type collector layer.

In the semiconductor device of the present invention, if a control voltage is not applied to the gate electrode, the inversion layer is not formed, and a current path is blocked. The pn junction between the second conductive type base layer/the second conductive type column layer and the first conductive type base layer constitutes a parasitic diode. This parasitic diode is turned on when a forward-bias voltage is applied, and is turned off when a reverse-bias voltage is applied. When the parasitic diode starts turning off, carriers (holes) in the second conductive type base layer and the second conductive type column layer move toward the source electrode, and carriers (electrons) in the first conductive type base layer move toward the drain electrode, that is, a reverse recovery occurs. The resultant current is referred to as a reverse-recovery current. As a result of the movement of the carriers, the depletion layer widens from the pn junction, and the parasitic diode is turned off.

As described, the depletion layer stopper region is provided in the first conductive type base layer between the second conductive type column layer and the second conductive type collector layer. The depletion layer stopper region includes heavy particles that were turned into donors. With this depletion layer stopper region, the expansion of the depletion layer toward the drain electrode is suppressed, thereby slowing down the expansion rate of the depletion layer in the process of turning the parasitic diode off. As a result, a rate of change in reverse recovery current is made smaller, and therefore, the recovery characteristics are improved. That is, an MOSFET that has a super-junction structure, which makes possible improvements in the ON resistance and the switching speed, and that has excellent recovery characteristics can be provided.

In the semiconductor device of the present invention, it is preferable that the first conductive type base layer be further provided with a trap level region that includes second heavy particles that form trap levels.

With this configuration, the first conductive type base layer has a trap level region including second heavy particles that form trap levels. In this trap level region, carriers (electrons) that move within the first conductive type base layer are captured, which can suppress the reverse recovery current. That is, the recovery characteristics can be improved by the depletion layer stopper region, and the reverse recovery time can be shortened by the trap level region. This makes it possible to use the parasitic diode as an FRD (first recovery diode) of the semiconductor device that operates in a manner similar to an IGBT in high current operations. As a result, a need to provide an FRD in the semiconductor device can be eliminated.

It is preferable that the thickness of the depletion layer stopper region be greater than the thickness of the trap level region.

If trap levels are distributed widely, it is possible that the pn junction portion between the second conductive type column layer and/or the second conductive type base layer and the first conductive type base layer has many trap levels (recombination centers) therein, which may cause an increase in leakage current. Therefore, it is preferable that the trap levels be distributed locally in a minimum area. On the other hand, the depletion layer stopper region is formed to cover a relatively large area in the first conductive type base layer between the second conductive type column layer and the first conductive type base layer, thereby effectively suppressing the expansion rate of the depletion layer and improving the recovery characteristics.

When heavy particles that have relatively small mass (protons, for example) are radiated to the semiconductor layer, the heavy particles that entered the semiconductor layer are distributed widely. In contrast, when heavy particles that have relatively large mass (helium atomic nuclei, for example) are radiated to the semiconductor layer, the heavy particles that entered the semiconductor layer are distributed in a relatively narrow area in accordance with the kinetic energy thereof. Therefore, by using heavy particles that have relatively small mass as the first heavy particles that form the depletion layer stopper region, and by using heavy particles that have relatively large mass as the second heavy particles that form the trap level region, the depletion layer stopper region can be made thick, and the trap level region can be made thin.

The second heavy particles may include one of protons, $^3He^{++}$, and $^4He^{++}$. The first heavy particles may include one of protons, $^3He^{++}$, and $^4He^{++}$.

A method of manufacturing a semiconductor device of the present invention includes: forming a first conductive type base layer; forming a second conductive type base layer in a part of a front surface portion of the first conductive type base layer; forming a first conductive type source layer in a part of a front surface portion of the second conductive type base layer; forming a second conductive type column layer in the first conductive type base layer continuously from the second conductive type base layer, the second conductive type column layer extending from the second conductive type base layer toward a rear surface of the first conducive type base layer; forming a gate insulating film on a front surface of the second conductive type base layer located between the first conductive type source layer and the first conductive type base layer; forming a gate electrode on the gate insulating film so as to face, through the gate insulating film, the second conductive type base layer located between the first conductive type source layer and the first conductive type base layer; forming a source electrode electrically connected to the first conductive type source layer; forming a second conductive type collector layer in a part of a rear surface portion of the first conductive type base layer; and forming a drain electrode electrically connected to the first conductive type base layer and the second conductive type collector layer.

With this method, the semiconductor device of the present invention can be manufactured.

In the method of manufacturing a semiconductor device of the present invention, it is preferable that the step of forming the second conductive type collector layer include: conducting ion implantation of a second conductive type impurity into a selected part of a rear surface of the first conductive type base layer; and conducting an annealing process, to form the second conductive type collector layer.

It is preferable that the method of manufacturing a semiconductor device of the present invention further include: conducting ion implantation of a first conductive type impurity into a rear surface of the first conductive type base layer; and conducting an annealing process, to form a first conductive type contact layer that has a higher impurity concentration than that of other portions of the first conductive type base layer in a rear surface portion of the first conductive type base layer.

With this method, it is possible to manufacture a semiconductor device that can achieve an excellent ohmic contact between the first conductive type base layer and the drain electrode.

In the method of manufacturing a semiconductor device of the present invention, it is preferable that the step of forming the second conductive type collector layer be conducted after the step of forming the first conductive type contact layer, and include a two-step ion implantation process of implanting boron (B) ions and thereafter implanting boron difluoride ($BF_2$) ions. In this case, in the step of implanting boron difluoride ($BF_2$) ions, $BF_2$ ions may be implanted at a lower energy than that in the step of implanting boron (B) ions.

With this method, a second conductive type impurity can be introduced into a portion of the first conductive type contact layer at a higher concentration than the first conductive type impurity concentration in the portion, thereby changing the conductive type of that portion from the first conductive type to the second conductive type. This makes it possible to form the second conductive type collector layer efficiently.

In the method of manufacturing a semiconductor device of the present invention, it is preferable that the annealing process conducted to form the second conductive type collector layer be a laser annealing process.

With this method, the elements that are to be annealed such as the first conductive type base layer do not undergo a high temperature process, and therefore, metallic elements that can melt at high temperatures (such as the source electrode) can be formed prior to this annealing process. This allows most of or all of the structures on the front surface side of the first conductive type base layer to be formed before the annealing process. Because this eliminates a need to flip over the first conductive type base layer many times, the manufacturing efficiency can be improved.

In the method of manufacturing a semiconductor device of the present invention, it is preferable that the step of forming the first conductive type base layer include: forming the first conductive type base layer on a substrate by epitaxial growth; and removing the substrate after the source electrode is formed.

With this method, because the first conductive type base layer is supported by the substrate until the source electrode is formed, transfer and handling of the first conductive type base layer can be made easier.

In this case, it is preferable that the step of removing the substrate include grinding the substrate from a rear surface thereof.

With this method, the grinding of the first conductive type base layer from the rear surface thereof can be conducted immediately after the grinding of the substrate. This makes it easier to adjust the thickness between the rear surface of the first conductive type base layer and the lower end of the second conductive type column layer, for example.

In the method of manufacturing a semiconductor device of the present invention, when the step of forming the first conductive type base layer includes repeatedly conducting a step of forming a first conductive type semiconductor layer and a step of selectively injecting a second conductive type impurity into a prescribed area of the first conductive type semiconductor layer, to obtain a plurality of first conductive type semiconductor layers stacked such that areas doped with the second conductive type impurity correspond to each other in a vertical direction, thereby forming the first conductive type base layer, the step of forming the second conductive type column layer may include conducting an annealing process to the first conductive type base layer such that the second conductive type impurity in the plurality of first conductive type semiconductor layers is diffused, thereby forming the second conductive type column layer.

In the method of manufacturing a semiconductor device of the present invention, the step of forming the second conductive type column layer may include: forming a trench in a selected area of the first conductive type base layer; depositing a second conductive type semiconductor layer so as to fill the trench and cover the front surface of the first conductive type base layer; and removing the second conductive type semiconductor layer outside of the trench by etch-back, to form the second conductive type column layer embedded in the trench.

In the method of manufacturing a semiconductor device of the present invention, the step of forming the first conductive type base layer may include forming a first conductive type drift layer on a first conductive type substrate by epitaxial growth, and the step of forming the second conductive type collector layer may include: conducting ion implantation of a second conductive type impurity into a part of the front surface of the first conductive type substrate to form the second conductive type collector layer before forming the first conductive type drift layer; and grinding the first conductive type substrate from a rear surface thereof after the first drift layer is grown so as to expose the second conductive type collector layer from the rear surface of the first conductive type substrate.

In the method of manufacturing a semiconductor device of the present invention, the step of forming the first conductive type base layer may include forming a first conductive type drift layer on a first conductive type substrate by epitaxial growth, and the step of forming the second conductive type collector layer may include: etching a front surface of the first conductive type substrate to form a trench in a selected area of the first conductive type substrate before forming the first conductive type drift layer; depositing a second conductive type semiconductor layer to cover the front surface of the first conductive type substrate; grinding the second conductive type semiconductor layer outside of the trench to form the second conductive type collector layer embedded in the trench; and grinding the first conductive type substrate from a rear surface thereof after the first drift layer is grown so as to expose the second conductive type collector layer from the rear surface of the first conductive type substrate.

It is to be understood that both the foregoing general description and the following detailed description are exemplary and explanatory, and are intended to provide further explanation of the invention as claimed.

BRIEF DESCRIPTION OF THE DRAWINGS

FIG. 16A shows the entire graph. FIG. 16B shows an enlarged view of an area surrounded by the broken line in FIG. 16A.

FIG. 17A shows the entire graph. FIG. 17B shows an enlarged view of an area surrounded by the broken line in FIG. 17A.

FIG. 18 shows a concentration profile of boron (B) in the n⁻-type base layer in the depth direction.

FIG. 19A shows the entire graph. FIGS. 19B and 19C show enlarged views of areas surrounded by the broken lines in FIG. 19A, respectively.

DETAILED DESCRIPTION OF THE PREFERRED EMBODIMENTS

Below, embodiments of the present invention will be explained in detail with reference to figures.

Figure 1:
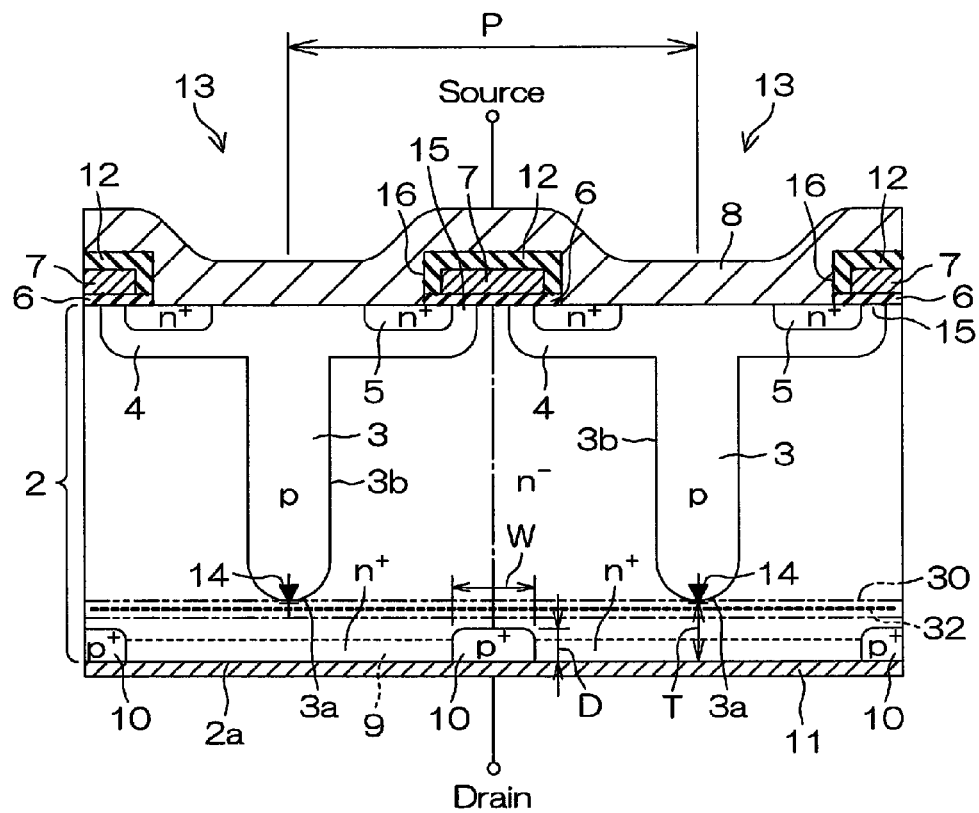
FIG. 1 is a schematic cross-sectional view of a semiconductor device according to Embodiment 1 of the present invention.
Figure 2:
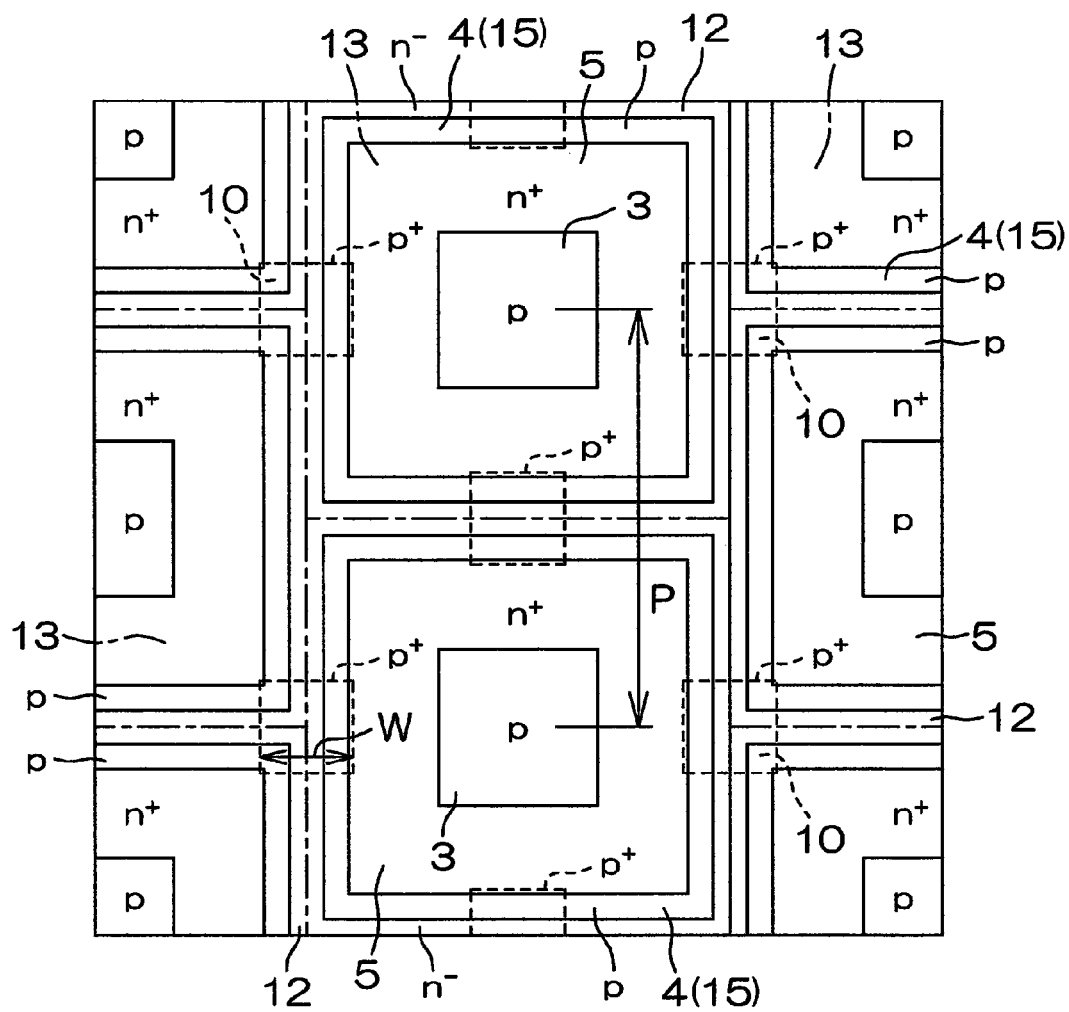
FIG. 2 is a plan view showing an example of the plan view layout of semiconductor layers.

FIG. 1 is a schematic cross-sectional view of a semiconductor device according to Embodiment 1 of the present invention. This semiconductor device 1 is an n-channel type MOSFET (metal oxide semiconductor field effect transistor) that has a super-junction structure. More specifically, the semiconductor device 1 includes an n⁻-type base layer 2, p-type column layers 3, p-type base layers 4, n⁺-type source layers 5, a gate insulating film 6, a gate electrode 7, a source electrode 8 (not shown in FIG. 2), an n⁺-type contact layer 9, p⁺-type collector layers 10, a drain electrode 11, a depletion layer stopper region 30, and a trap level region 32. An interlayer insulating film 12 is disposed on the gate electrode 7.

The n⁻-type base layer 2 is a semiconductor layer doped with an n-type impurity. More specifically, the n⁻-type base layer 2 may be an n-type epitaxial layer formed by epitaxial growth while injecting an n-type impurity. As the n-type impurity, P (phosphorus), As (arsenic), Sb (antimony), or the like can be used.

The p-type column layers 3 and the p-type base layers 4 are respectively semiconductor layers doped with a p-type impurity. More specifically, the p-type column layers 3 and the p-type base layers 4 may be semiconductor layers formed by introducing a p-type impurity into the n⁻-type base layer 2 by ion implantation. As the p-type impurity, B (boron), Al (aluminum), Ga (gallium), or the like can be used.

Figure 3:
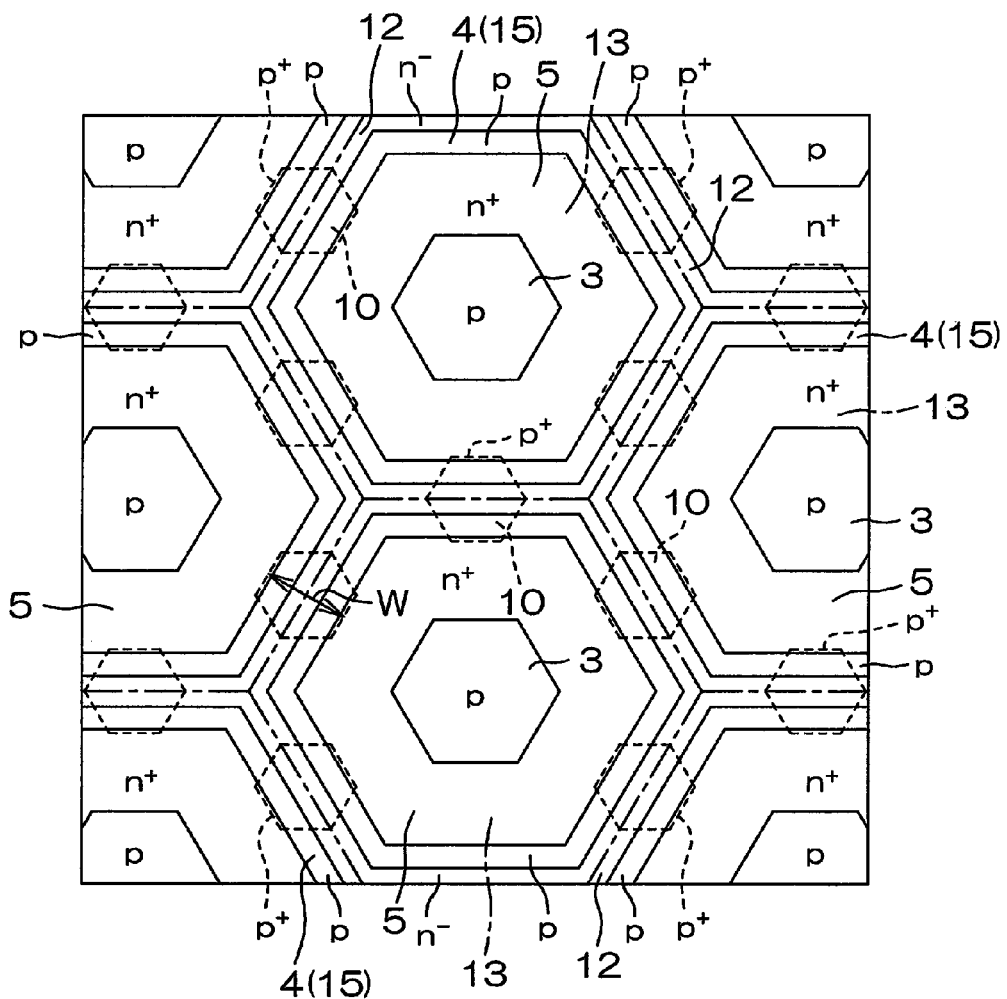
FIG. 3 is a plan view showing another example of the plan view layout of semiconductor layers.
Figure 4:
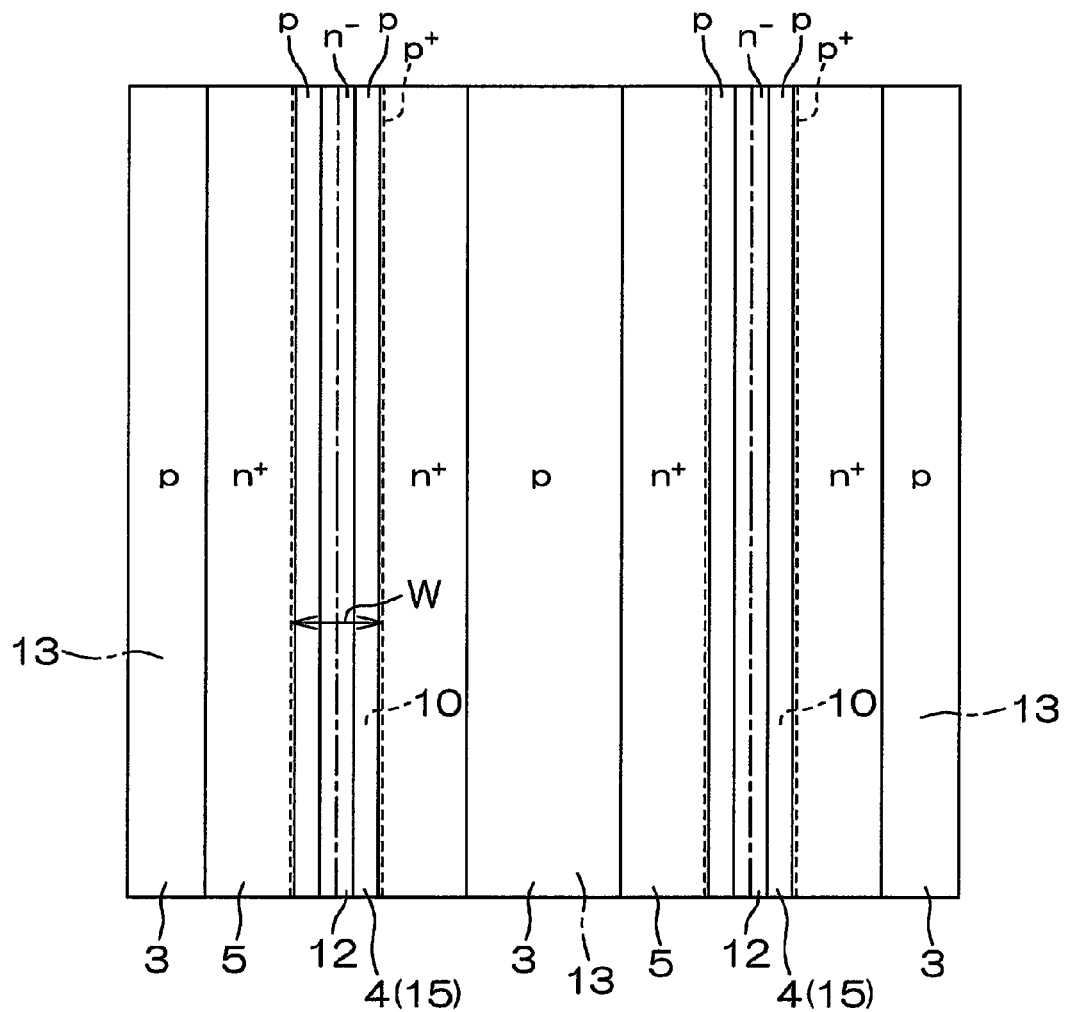
FIG. 4 is a plan view showing yet another example of the plan view layout of semiconductor layers.

The p-type base layers 4 are selectively formed in a front surface portion of the n⁻-type base layer 2 in a plurality of regions arranged at regular intervals in a plan view of the semiconductor device 1. For example, as shown in the plan view of FIG. 2, the p-type base layers 4 in a rectangular shape may be arranged in a staggered pattern. Alternatively, as shown in the plan view of FIG. 3, the p-type base layers 4 in a hexagon shape may be arranged in a staggered pattern. Further, as shown in the plan view of FIG. 4, the p-type base layers 4 in a strip shape may be arranged in a stripe pattern. A region that includes each p-type base layer 4 and the n⁻-type base layer 2 in the periphery thereof forms a cell 13. That is, in the layouts shown in FIGS. 2 and 3, this semiconductor layer 1 has a plurality of cells 13 arranged in a grid pattern in a plan view. In the layout shown in FIG. 4, a plurality of cells 13 are arranged in a stripe pattern in a plan view. The pitch P of these cells 13 (cell width) is 5.0 μm to 20 μm.

Each of the p-type column layers 3 is formed inside of the p-type base layer 4 in each cell 13 in a plan view. More specifically, in this embodiment, each p-type column layer 3 is formed in the substantially center region of the p-type base layer 4 in a shape similar to that of the p-type base layer 4 in a plan view, for example (rectangular shape in the plan view layout of FIG. 2; hexagon shape in the plan view layout of FIG. 3; and strip shape in the plan view layout of FIG. 4). The p-type column layer 3 is formed continuously from the p-type base layer 4, and is extended beyond the p-type base layer 4 toward the rear surface 2a of the n⁻-type base layer 2. That is, the p-type column layer 3 is formed in a substantial columnar shape or strip shape (substantial square column in the layout of FIG. 2; substantial hexagon column in the layout of FIG. 3; substantial rectangular strip (plate shape) in the layout of FIG. 4). It is preferable that the thickness T of the n⁻-type base layer 2 from the bottom 3a of the p-type column layer 3 to the rear surface 2a of the n⁻-type base layer 2 be 15 μm or more. When T is set to be 15 μm or greater, a breakdown voltage of 600V or higher is ensured. A side face 3b of each p-type column layer 3 (boundary with the n⁻-type base layer 2) faces a side face 3b of an adjacent p-type column layer 3 through the n⁻-type base layer 2.

The boundary surface where the p-type base layer 4 and the p-type column layer 3 make contact with the n⁻-type base layer 2 is a pn-junction surface, at which a parasitic diode (body diode) 14 is formed.

Each of the n⁺-type source layers 5 is disposed inside a p-type base layer 4 in each cell 13 in a plan view, and is formed in a selected region of the front surface portion of the p-type base layer 4. The n⁺-type source layer 5 may be formed by selectively introducing an n-type impurity into the p-type base layer 4 by ion implantation. Examples of the n-type impurity were provided above. The n⁺-type source layer 5 is formed inside the p-type base layer 4 at a prescribed distance from the boundary between the p-type base layer 4 and the n⁻-type base layer 2. With this configuration, in the surface region of the semiconductor layer that includes the n⁻-type base layer 2, the p-type base layers 4, and the like, the surface portions of the p-type base layers 4 are present between the respective n⁺-type source layers 5 and the n⁻-type base layers 2, and these surface portions serve as channel regions 15.

In this embodiment, the n⁺-type source layer 5 is formed in a ring shape or a strip shape in a plan view (rectangular ring shape in the layout of FIG. 2; hexagonal ring shape in the layout of FIG. 3; strip shape in the layout of FIG. 4), and is formed in a region outside of the side face 3b of each p-type column layer 3 in a plan view. The channel regions 15 are formed in a ring shape or a strip shape in a plan view, corresponding to the shape of the n⁺-type source layer 5 (rectangular ring shape in the layout of FIG. 2; hexagonal ring shape in the layout of FIG. 3; strip shape in the layout of FIG. 4).

The gate insulating film 6 may be made of a silicon oxide film, a silicon nitride film, a silicon oxide nitride film, a hafnium oxide film, an alumina film, a tantalum oxide film, or the like. The gate insulating film 6 is formed so as to cover the surface of the p-type base layer 4 at least in each channel region 15. In this embodiment, the gate insulating film 6 is formed so as to cover the surfaces of a part of the n⁺-type source layer 5, the channel region 15, and the n⁻-type base layer 2. In short, the gate insulating film 6 is patterned so as to have openings that correspond to the center regions of the p-type base layers 4 and the inner edge regions of the n⁺-type source layers 5 adjacent thereto in the respective cells 13.

The gate electrode 7 is formed so as to face the channel regions 15 through the gate insulating film 6. The gate electrode 7 may be made of polysilicon doped with an impurity to reduce resistance. In this embodiment, the gate electrode 7 is patterned in the substantially same manner as the gate insulating film 6 and covers the surface of the gate insulating film 6. That is, the gate electrode 7 is disposed above a part of the n⁺-type source layer 5, the channel region 15, and the n⁻-type base layer 2. In short, the gate electrode 7 is patterned so as to have openings that correspond to the center regions of the p-type base layers 4 and the inner edge regions of the n⁺-type source layers 5 adjacent thereto in the respective cells 13. In other words, the gate electrode 7 is formed so as to collectively control the plurality of cells 13. In the manner described above, the planar gate structure is constructed.

The interlayer insulating film 12 is made of an insulating material such as silicon oxide, silicon nitride, or TEOS (tetraethyl orthosilicate), for example. The interlayer insulating film 12 is formed so as to cover the top and side faces of the gate electrode 7 and so as to have contact holes 16 that correspond to the center regions of the p-type base layers 4 and the inner edge regions of the n⁺-type source layers 5 adjacent thereto in the respective cells 13.

The source electrode 8 is made of a metal such as aluminum. The source electrode 8 is formed so as to cover the surface of the interlayer insulating film 12 and so as to fill the contact holes 16 in the respective cells 13. This way, an ohmic connection between the source electrode 8 and the n⁺-type source layers 5 is achieved. The source electrode 8 is connected to the plurality of cells 13 in parallel, and is configured to carry the total current that flows through the plurality of cells 13. Also, the source electrode 8 is formed so as to establish an ohmic connection with the p-type base layer 4 in each cell 13 through a contact hole 16, thereby stabilizing the potential of the p-type base layer 4.

The n⁺-type contact layer 9 is formed near the rear surface 2a of the n⁻-type base layer 2 (rear surface portion) so as to cover the entire rear surface 2a. The n⁺-type contact layer 9 is provided so as not to make contact with the bottom 3a of each p-type column layer 3. That is, the n⁻-type base layer 2 is interposed between the p-type column layer 3 and the n⁺-type contact layer 9.

The p⁺-type collector layer 10 has an impurity concentration of $1\times10^{17}$ cm$^{-3}$ to $1\times10^{22}$ cm$^{-3}$. In Embodiment 1, the impurity concentration of the p⁺-type collector layer 10 changes in the directions along and orthogonal to the rear surface 2a of the n⁻-type base layer 2 within the above range. For example, in the direction orthogonal to the rear surface 2a of the n⁻-type base layer 2, the impurity concentration of the p⁺-type collector layer 10 gradually decreases toward the rear surface 2a of the n⁻-type base layer 2.

In this embodiment, the p⁺-type collector layers 10 are located along the rear surface 2a of the n⁻-type base layer 2 so as not to be directly below the p-type column layers 3. More specifically, the respective p⁺-type collector layers 10 are disposed directly below the gate electrode 7. This way, the p⁺-type collector layers 10 face the gate electrode 7 in the thickness direction of the n⁻-type base layer 2. The p⁺-type collector layers 10 are selectively formed in such positions in the rear surface portion of the n⁻-type base layer 2 so as to penetrate the n⁺-type contact layer 9 in the thickness direction and reach the n⁻-type base layer 2.

In this embodiment, the p⁺-type collector layers 10 are formed in an enclosed shape or a strip shape in a plan view (rectangular shape in the layout of FIG. 2; hexagon shape in the layout of FIG. 3; strip shape in the layout of FIG. 4), and each of them is formed so as to bridge over the adjacent cells 13 in a plan view. The p⁺-type collector layers 10 have a depth D of 0.2 μm to 3 μm from the rear surface 2a of the n⁻-type base layer 2 in the thickness direction of the n⁻-type base layer 2. Also, the p⁺-type collector layers 10 have a prescribed width W of more than 6 μm and 16 μm or less in the direction along the rear surface 2a of the n⁻-type base layer 2. When the p⁺-type collector layers 10 are formed to be substantially square in a plan view, for example, each side of the p⁺-type collector layers 10 may be set to more than 6 μm and 16 μm or less. When the p⁺-type collector layers 10 are formed such that the width W is within the above range, the ohmic characteristics can be realized in low current operations and excellent conductivity modulation can be achieved in high current operations. The shape of the p⁺-type collector layers 10 of the present invention is not limited to those described above, and can be formed in any shape as long as they occupy a certain area on the lower surface of the device. For example, it is preferable that the area occupied by the p⁺-type collector layers 10 be 50 to 90% of the lower surface of the device, and it is more preferable that the occupied area be 65 to 75%.

The drain electrode 11 is made of a metal such as aluminum. The drain electrode 11 is formed on the rear surface 2a of the n⁻-type base layer 2 so as to make contact with the n⁺-type contact layer 9 and the p⁺-type collector layers 10. This way, the drain electrode 11 is connected to the plurality of cells 13 in parallel, and is configured to carry the total current that flows through the plurality of cells 13. In this embodiment, the n⁺-type contact layer 9 is formed near the rear surface 2a of the n⁻-type base layer 2, allowing an ohmic contact between the drain electrode 11 and the n⁻-type base layer 2.

When a DC power source is connected to the source electrode 8 and the drain electrode 11 such that the drain electrode 11 is on the higher potential side and the source electrode 8 is on the lower potential side, the parasitic diode 14 becomes reverse-biased. At this time, if the gate electrode 7 is applied with a control voltage that is lower than a prescribed threshold voltage, no current path is formed between the drain and the source. That is, the semiconductor device 1 is off. On the other hand, when the control voltage higher than the threshold voltage is applied to the gate electrode 7, electrons move toward the front surface of the channel region 15, thereby forming an inversion layer (channel). This makes it possible to establish electrical continuity between the n+-type source layers 5 and the n−-type base layer 2. That is, a current path from the source electrode 8 to the drain electrode 11 via the n+-type source layer 5, the inversion layer of the channel region 15, and the n−-type base layer 2 is formed. That is, the semiconductor device 1 is turned on.

In this configuration, the p-type column layer 3 formed continuously from the p-type base layer 4 is extended toward the rear surface 2a of the n−-type base layer 2, thereby forming an MOSFET of a super-junction structure. With this super-junction structure, the depletion layer can be expanded along the boundary between the p-type column layer 3 and the n−-type base layer 2 (that is, the thickness direction of the n−-type base layer 2). As a result, it is possible to prevent electric fields from being concentrated in a localized area in the n−-type base layer 2, which allows the semiconductor device 1 to have a lower ON resistance and a higher breakdown voltage.

Further, in this semiconductor device 1, electrons or holes are injected into the n−-type base layer 2 from the p+-type collector layers 10 that are selectively formed in the rear surface portion of the n−-type base layer 2, allowing the conductivity modulation to occur in the n−-type base layer 2. As a result, in high current operations, the current can rise in a manner similar to a current waveform of an IGBT.

That is, the semiconductor device 1 is equipped with MOSFETs that can reduce the ON resistance in low current operations and that can perform the conductivity modulation in high current operations, thereby making it possible to achieve optimum device characteristics for desired applications.

When the semiconductor device 1 is used for an inverter circuit that drives an inductive load such as an electric motor, the parasitic diode 14 may be turned on as a result of the source electrode 8 having a higher potential than the drain electrode 11, and a current may flow through this parasitic diode 14. Thereafter, when the potential of the source electrode 8 is made lower than that of the drain electrode 11, the parasitic diode 14 is reverse-biased and therefore starts turning off. When the parasitic diode 14 starts turning off, the depletion layer expands from the pn junction of the parasitic diode 14, carriers (holes) in the p-type base layer 4 and the p-type column layer 3 move toward the source electrode 8, and carriers (electrons) in the n−-type base layer 2 move toward to the drain electrode 11. As a result of this movement of carriers, a current that flows in the opposite direction from the ON state of the parasitic diode 14 is generated. This current is termed a reverse recovery current. The reverse recovery current rises and thereafter decreases. A period of time from when the forward-biased current of the diode becomes zero to when the size of the reverse-recovery current is reduced to 10% of its peak is referred to as a reverse-recovery time. When the rate of change in reverse-recovery current (di/dt) is great, it is possible that vibrations (ringing) occur in the process of the current value converging to zero. Such a reverse recovery behavior is termed hard recovery, and causes noises or erroneous operations.

The trap level region 32 reduces the reverse recovery time. The depletion layer stopper region 31 mitigates the hard recovery.

The trap level region 32 is formed by radiating heavy particles to the n−-type base layer 2 from the rear surface 2a side. The trap level region 32 includes a large number of recombination centers, in which carriers are captured, recombined, and eliminated. As a result, the carriers can be eliminated at a faster rate in turning off the parasitic diode 14, achieving a reduction in reverse recovery time and reverse recovery current.

The trap level region 32 is provided in a localized area in the n−-type base layer 2 so as to spread as a thin layer (thickness of about 1 to 3 µm, for example) at a prescribed position from the rear surface 2a of the n−-type base layer 2. The trap level region 32 may be in contact with the p-type column layers 3, or may be positioned between the bottoms 3a of the p-type column layers 3 and the p+-type collector layers 10 without making contact with the p-type column layers 3. If the trap level region 32 is located closer to the bottom 3a of the p-type column layer 3, the reverse recovery time can be reduced more effectively, and if the trap level region 32 is located further away from the bottom 3a of the p-type column layer 3, the drain-source leakage current can be reduced more effectively. In order to reduce both the reverse recovery time and the drain-source leakage current, it is preferable that the center position of the trap level region 32 in the thickness direction be located within a range of 5 µm to 10 µm from the bottom 3a of the p-type column layer 3 on the side closer to the p+-type collector layer 10. With this configuration, the reverse recovery time can be reduced to 80 nsec or lower and the drain-source leakage current can be reduced to several µA or less, for example. Thus, the parasitic diode 14 can be used as an FRD (first recovery diode) of the semiconductor device 1 that operates in a manner similar to an IGBT in high current operations. As a result, an FRD in the semiconductor device 1 can be omitted.

The trap level region 32 can be formed by radiating heavy particles such as protons, $^3$He$^{++}$, and $^4$He$^{++}$. Among them, helium atomic nuclei having greater mass ($^3$He$^{++}$ or $^4$He$^{++}$) can make the distribution area of the recombination centers narrower in the thickness direction, and are therefore preferable.

The depletion layer stopper region 30 is formed by radiating heavy particles to the n−-type base layer 2 from the rear surface 2a side, and conducting heat treatment to make the heavy particles donors. The heavy particles that serve as donors suppress the expansion of the depletion layer from the pn junction of the parasitic diode 14 in the process of turning off. Because this slows down the expansion of the depletion layer, the rate of change in reverse recovery current can be reduced, thereby mitigating the hard recovery.

The depletion layer stopper region 30 is formed in the n−-type base layer 2 so as to spread as a thick layer (thicker than the trap level region 32; about 5 µm to 10 µm-thick, for example) at a prescribed position from the rear surface 2a of the n−-type base layer 2. The depletion layer stopper region 30 may be in contact with the p-type column layers 3, or may not be in contact with the p-type column layers 3. The depletion layer stopper region 30 may have overlap regions with the p-type column layers 3, or instead of having overlap regions with the p-type column layers 3, the entire depletion layer stopper region 30 may be located between the bottoms 3a of the p-type column layers 3 and the p+-type collector layers 10. Because the depletion layer stopper region 30 includes donors, it is preferable to minimize the overlap region with the p-type column layers 3 to reduce the effect to the function of the p-type column layers 3. In order to effectively suppress the expansion of the depletion layer, however, it is preferable that the depletion layer stopper region 30 be close to the p-type column layers 3. Thus, as shown in FIG. 1, it is most preferable that the depletion layer stopper region 30 be arranged such that the upper edge of the depletion layer stopper region 30 comes at the substantially same level as the bottoms 3a of the p-type column layers 3.

The depletion layer stopper region 30 can be formed by radiating heavy particles such as protons, $^3$He$^{++}$, and $^4$He$^{++}$. Among them, protons that have smaller mass can be distributed widely in the thickness direction, and are therefore preferably used to form the thick depletion layer stopper region 30. Also, because protons can be turned into donors with heat treatment at relatively low temperatures (350° C. to 450° C., for example), proton radiation and heat treatment to make protons donors can be conducted regardless of the presence of the drain electrode 11 and the like, for example. Thus, by using protons, a degree of freedom in the manufacturing process is increased.

The arrangement of the depletion layer stopper region 30 and the arrangement of the trap level region 32, which were explained above, can be appropriately combined.

FIGS. 5A to 5J respectively illustrate manufacturing process steps of the semiconductor device 1 in process sequence.

Figure 5A:
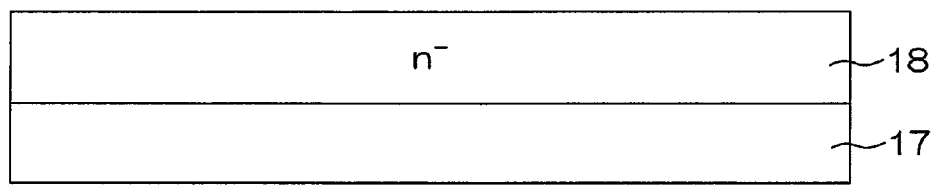
FIG. 5A illustrates a part of a manufacturing process of the semiconductor device shown in FIG. 1.

First, as shown in FIG. 5A, an initial base layer 18 is formed on a substrate 17 by epitaxial growth while injecting an n-type impurity thereto. The conditions of the epitaxial growth is 5.0 Ω·cm and a thickness of 50 μm, for example. As the substrate 17, an n-type silicon substrate can be used. Because this substrate 17 is removed later, there is no need to use a high-quality substrate, and an inexpensive substrate can be used.

Figure 5B:
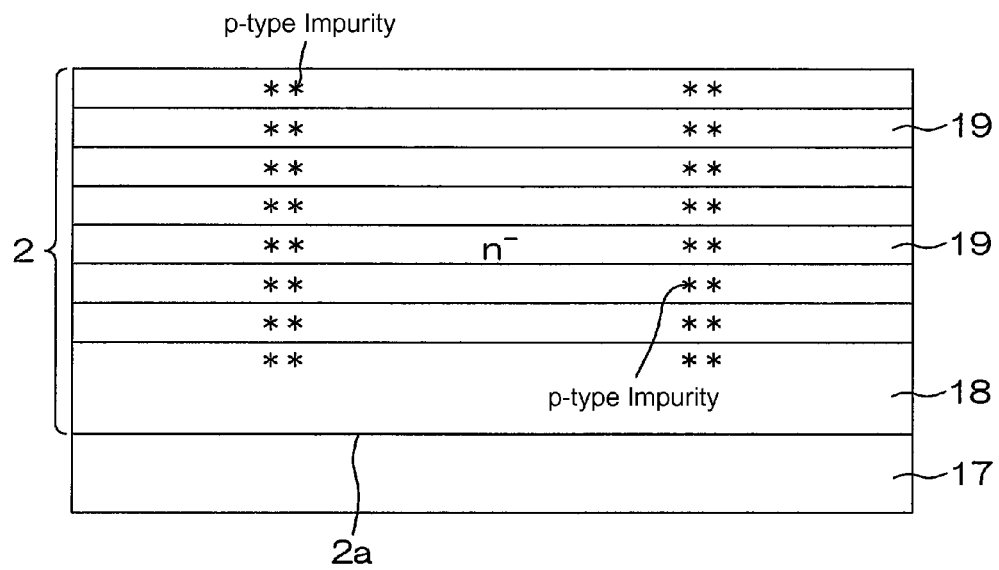
FIG. 5B illustrates a manufacturing step that follows the step shown in FIG. 5A.

Next, as shown in FIG. 5B, by a multiple epitaxial growth method in which a process of forming a thin n-type semiconductor layer 19 (5 Ω·cm/6 μm) on the initial base layer 18 and a process of selectively injecting a p-type impurity into prescribed locations (B ion implantation under the conditions of 50 keV, 5.3×10$^{13}$ cm$^{-2}$, and 0 degree) are repeated, a plurality of n-type semiconductor layers 19 are stacked such that areas doped with a p-type impurity correspond to each other in the vertical direction. This way, a plurality of n-type semiconductor layers 19 and the initial base layer 18 are integrally formed, thereby forming the n$^-$-type base layer 2.

Figure 5C:
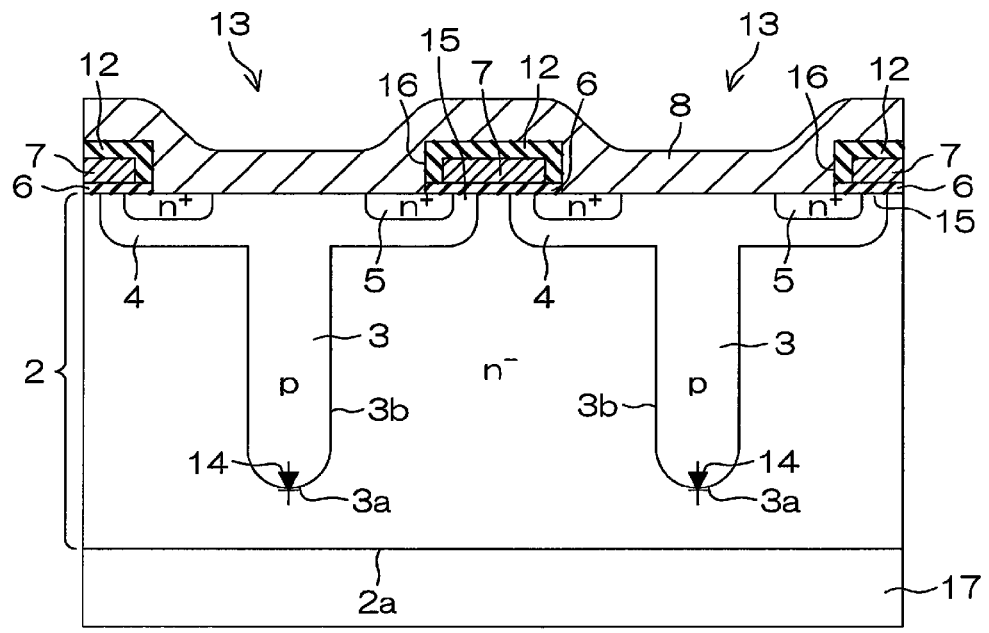
FIG. 5C illustrates a manufacturing step that follows the step shown in FIG. 5B.

Next, as shown in FIG. 5C, by conducting drive-in annealing (1000 to 1200° C.), the p-type impurity in the plurality of n-type semiconductor layers 19 is diffused. As a result, p-type column layers 3 are formed.

Next, in the front surface portion of the n$^-$-type base layer 2, a p-type impurity is injected into selected areas at a relatively low energy (B ion implantation under the conditions of 50 keV, 5.0×10$^{15}$ cm$^{-2}$, and 7 degrees), thereby forming p-type base layers 4. Thereafter, by selectively injecting an n-type impurity (P ion implantation under the conditions of 130 keV, 2.0×10$^{15}$ cm$^{-2}$, and 7 degrees) into ring-shaped regions having a prescribed width, n$^+$-type source layers 5 are formed. Each n$^+$-type source layer 5 is formed within the p-type base layer 4 such that the outer edge thereof is located at a prescribed distance inward from the outer edge of the p-type base layer 4 in a plan view.

Next, a gate insulating film 6 is formed so as to cover the surfaces of the n$^-$-type base layer 2 and the p-type base layers 4 (surface of semiconductor crystals). This gate insulating film 6 may be formed by thermally oxidizing the semiconductor crystal surface. On the gate insulating film 6, a gate electrode 7 is formed. The gate electrode 7 may be formed, for example, by forming a polysilicon film doped with an impurity to reduce resistance on the entire surface, and by thereafter selectively etching the polysilicon film by photolithography. The gate insulating film 6 may be patterned simultaneously in this etching such that the gate electrode 7 and the gate insulating film 6 have the same pattern. Further, an interlayer insulating film 12 (32000 Å -thick, for example) is formed to cover the gate electrode 7, and contact holes 16 are formed in this interlayer insulating film 12 by photolithography. Next, on the interlayer insulating film 12, the source electrode 8 is formed, and as necessary, heat treatment for alloying is conducted to achieve an ohmic contact. The source electrode 8 may be formed by forming a barrier film of Ti/TiN (250/1300 Å, for example) and depositing an AlCu film (4.2 μm, for example) on the barrier film, for example. Thereafter, a not-shown surface protective film (16000 Å -thick, for example) is formed, and in the surface protective film, pad openings are formed to expose part of the source electrode 8 as pads.

Figure 5D:
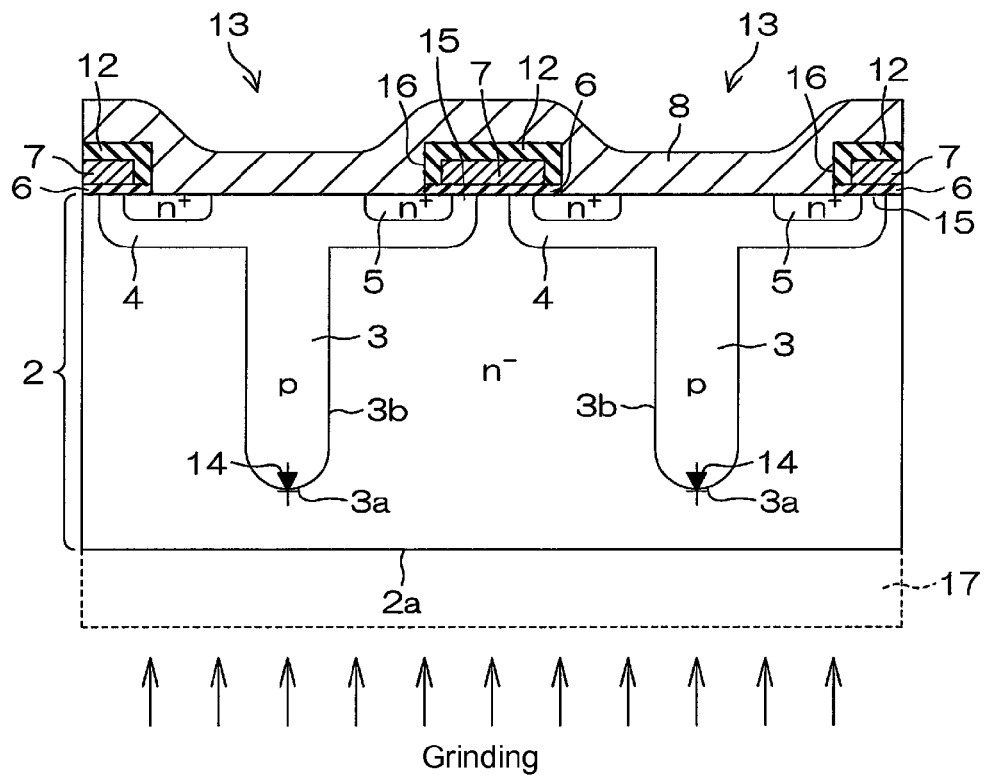
FIG. 5D illustrates a manufacturing step that follows the step shown in FIG. 5C.

Next, as shown in FIG. 5D, the substrate 17 is ground from the rear surface side by using a grinder or the like. This grinding is conducted such that the substrate 17 is completely removed and the rear surface 2a of the n$^-$-type base layer 2 is exposed, and such that the n$^-$-type base layer 2 immediately below the p-type column layer 3 has a thickness T of 30 μm or greater. After grinding, spin-etching is performed on the rear surface 2a of the n$^-$-type base layer 2, thereby polishing the rear surface 2a for mirror-finish.

As described above, because the n$^-$-type base layer 2 is supported by the substrate 17 until the middle of the manufacturing process, transfer and handling of the n$^-$-type base layer 2 can be made easier. The grinding of the n$^-$-type base layer 2 can be conducted immediately after the grinding of the substrate 17. This makes it easier to adjust the thickness T of the n$^-$-type base layer 2 below the p-type column layer 3.

Figure 5E:
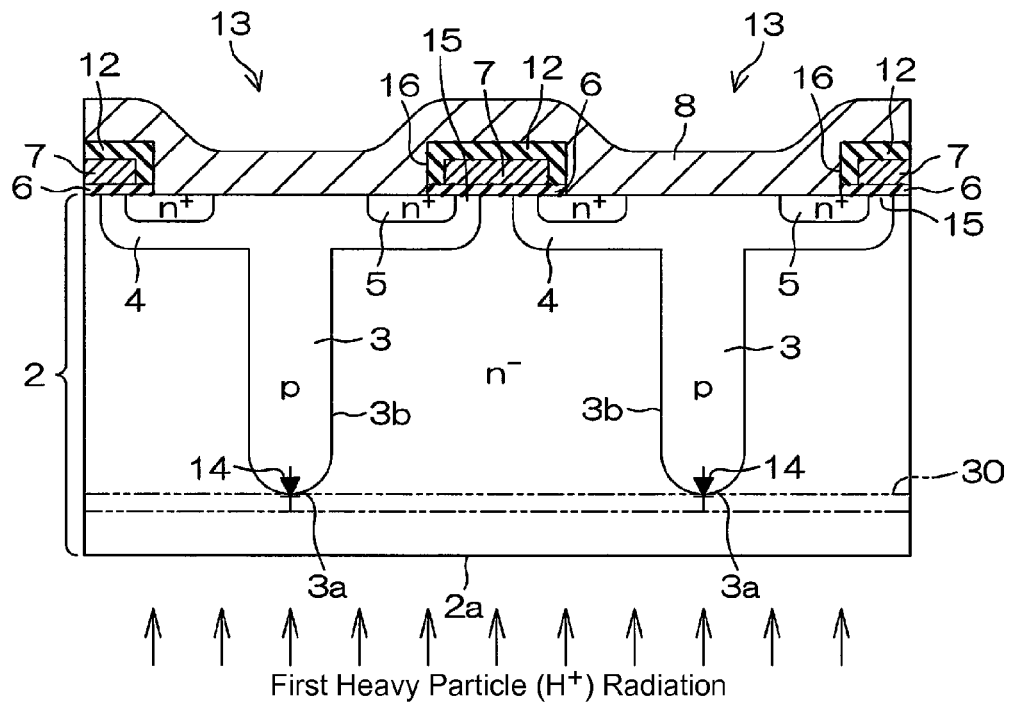
FIG. 5E illustrates a manufacturing step that follows the step shown in FIG. 5D.

Thereafter, as shown in FIG. 5E, the first heavy particle radiation is performed to the n$^-$-type base layer 2 from the rear surface 2a. As the heavy particles (first heavy particles) radiated here, heavy particles that have smaller mass such as protons are used. Next, a low temperature heat treatment (low temperature annealing) is conducted. As a result, the radiated heavy particles are turned into donors. When protons are selected as the first heavy particles, by conducting heat treatment at a temperature of about 350° C. to 450° C. (360° C., for example) for 30 to 90 minutes (60 minutes, for example), the implanted protons can be turned into donors.

By conducting the first heavy particle radiation and the low temperature heat treatment in the manner described above, a depletion layer stopper region 30 is formed. If the radiation energy of the first heavy particles is increased, the first heavy particles travel a longer distance, and therefore, the depletion layer stopper region 30 is formed further away from the rear surface 2a of the n$^-$-type base layer 2. If the radiation energy is reduced, the heavy particles travel a shorter distance, and therefore, the depletion layer stopper region 30 is formed closer to the rear surface 2a of the n$^-$-type base layer 2. Therefore, the radiation energy of the first heavy particles is set in accordance with the arrangement of the depletion layer stopper region 30. The radiation energy of the first heavy particles is set such that at least a part of the depletion layer stopper region 30 is located between the bottom 3a of the p-type column layer 3 and the p$^+$-type collector layers 10 (about 8 MeV, for example). The dosage of the first heavy particles (protons, for example) is set to be about 5×10$^{13}$ atom/cm$^2$ to 1×10$^{14}$ atom/cm$^2$, for example.

Figure 5F:
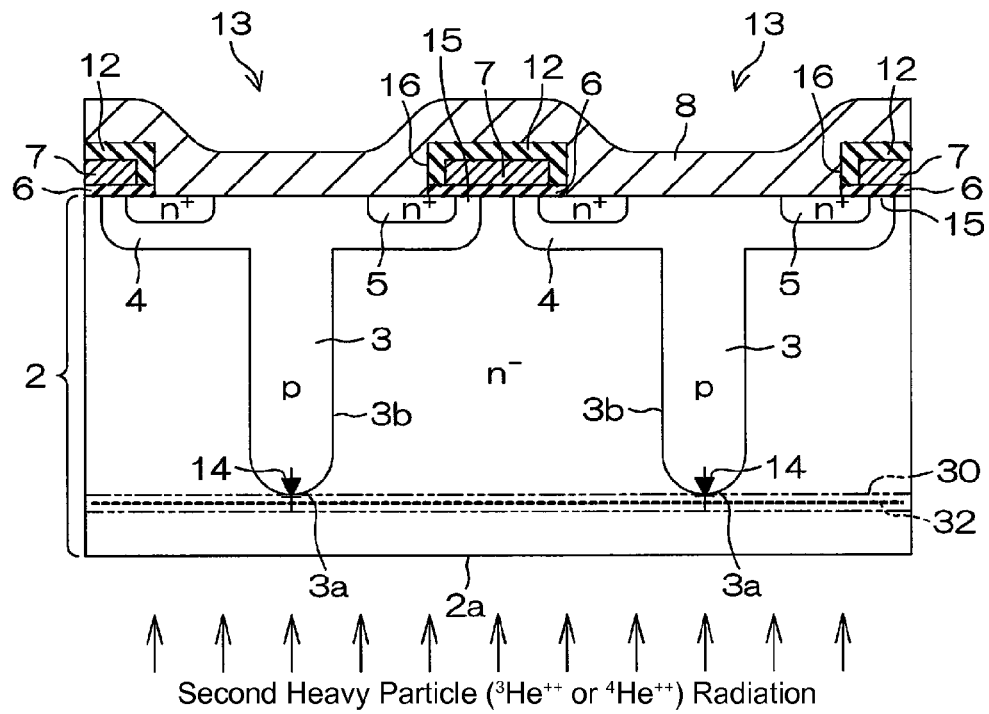
FIG. 5F illustrates a manufacturing step that follows the step shown in FIG. 5E.

Next, as shown in FIG. 5F, the second heavy particle radiation is conducted to the n$^-$-type base layer 2 from the rear surface 2a. As the heavy particles (second heavy particles) radiated here, heavy particles that have relatively large mass such as helium atomic nuclei ($^3$He$^{++}$ or $^4$He$^{++}$) are used. Next, low temperature heat treatment (low temperature annealing)

is conducted to activate the radiated second heavy particles. When the helium atomic nuclei ($^3$He$^{++}$ or $^4$He$^{++}$) are used as the second heavy particles, by conducting heat treatment at a temperature of 320° C. to 380° C. (350° C., for example) for 30 to 120 minutes (60 minutes, for example), for example, the implanted helium atomic nuclei can be activated.

The trap level region 32 is formed this way. If the radiation energy of the second heavy particles is increased, the second heavy particles travel a longer distance, and the trap level region 32 is formed further away from the rear surface 2a of the n$^-$-type base layer 2. If the radiation energy is reduced, the second heavy particles travel a shorter distance, and the trap level region 32 is formed closer to the rear surface 2a of the n$^-$-type base layer 2. Therefore, the radiation energy of the second heavy particles is set in accordance with the arrangement of the trap level region 32. The radiation energy of the second heavy particles is set such that at least a part of the trap level region 32 is located between the bottom 3a of the p-type column layer 3 and the p$^+$-type collector layers 10 (about 23 MeV, for example). The dosage of the heavy particles is set to be about $5 \times 10^{10}$ atom/cm$^2$ to $5 \times 10^{12}$ atom/cm$^2$, for example.

Figure 5G:
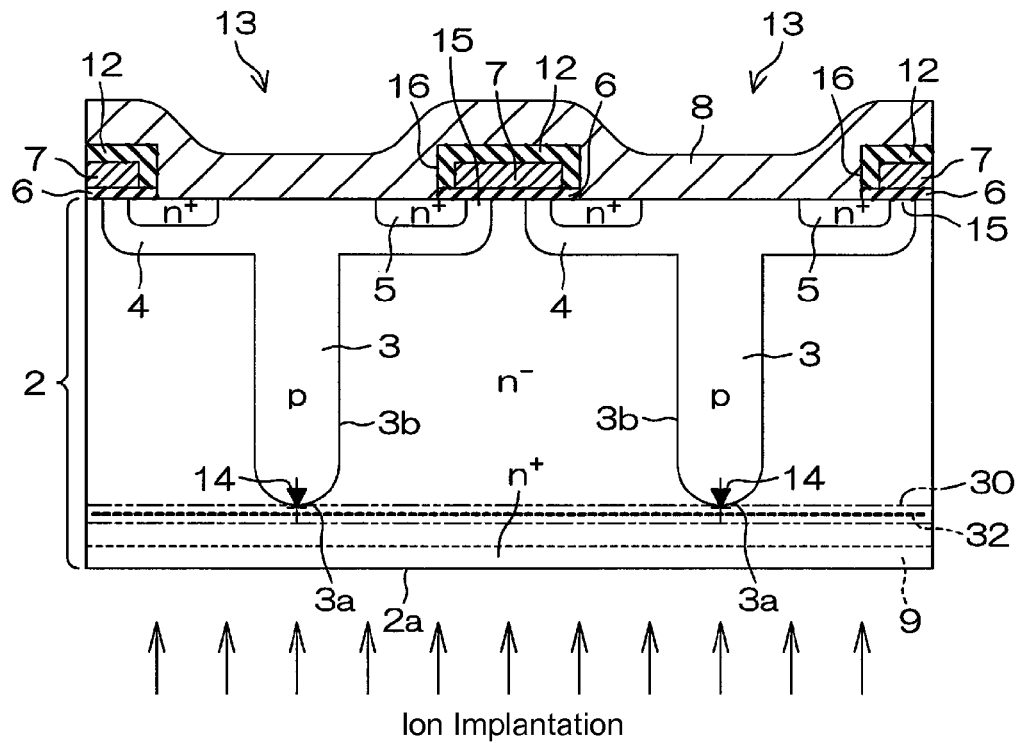
FIG. 5G illustrates a manufacturing step that follows the step shown in FIG. 5F.

Next, as shown in FIG. 5G, an n-type impurity is introduced to the entire rear surface 2a of the n$^-$-type base layer 2 by ion implantation (As ion implantation under the conditions of 30 keV, $1.0 \times 10^{15}$ cm$^{-2}$, and 0 degree), and by thereafter conducting annealing, an n$^+$-type contact layer 9 is formed.

Figure 5H:
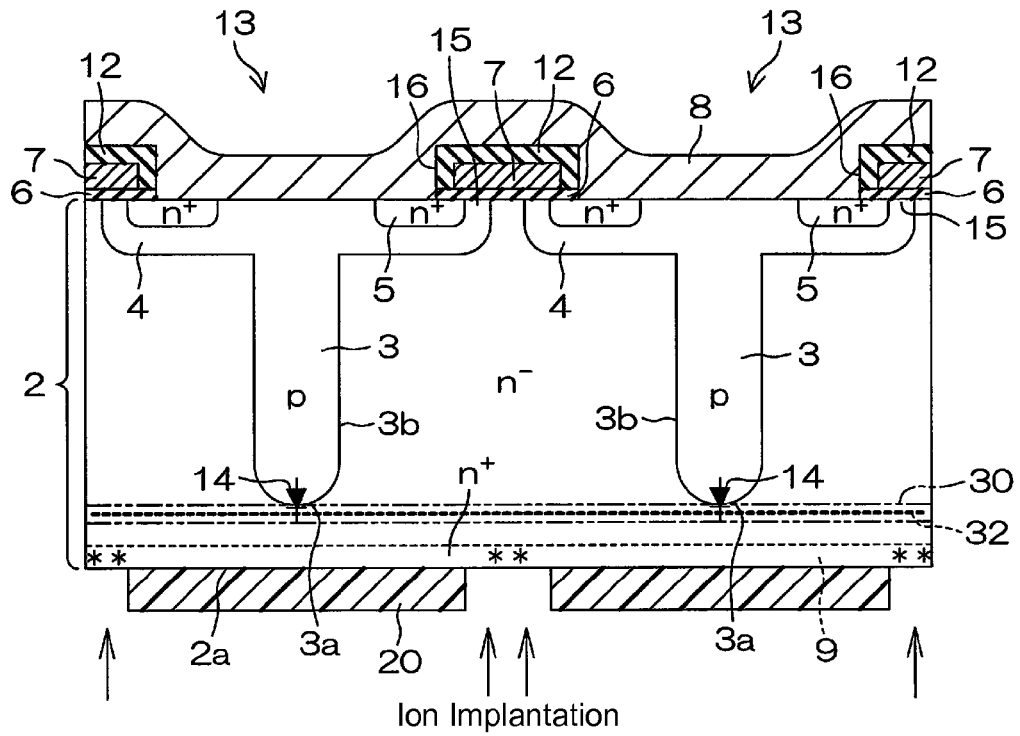
FIG. 5H illustrates a manufacturing step that follows the step shown in FIG. 5G.

Next, as shown in FIG. 5H, a photoresist 20 is formed so as to selectively expose the rear surface 2a of the n$^-$-type base layer 2. Thereafter, from above this photoresist 20, B ion implantation is conducted under the conditions of 100 keV, $1.0 \times 10^{15}$ cm$^{-2}$, and an inclination angle of 7 degrees. Thereafter, BF$_2$ ion implantation is conducted at a lower energy than that in the B ion implantation, i.e., 30 keV, $1.0 \times 10^{15}$ cm$^{-2}$, and 7 degrees (same inclination angle). B ions and BF$_2$ ions are injected with a prescribed inclination angle relative to the rear surface 2a of the n$^-$-type base layer 2, instead of being injected from the perpendicular direction thereto. This makes it possible to prevent the ions from going too deep into the n$^-$-type base layer 2, or in other words, channeling. Next, the photoresist 20 is removed by ashing, for example.

Figure 5I:
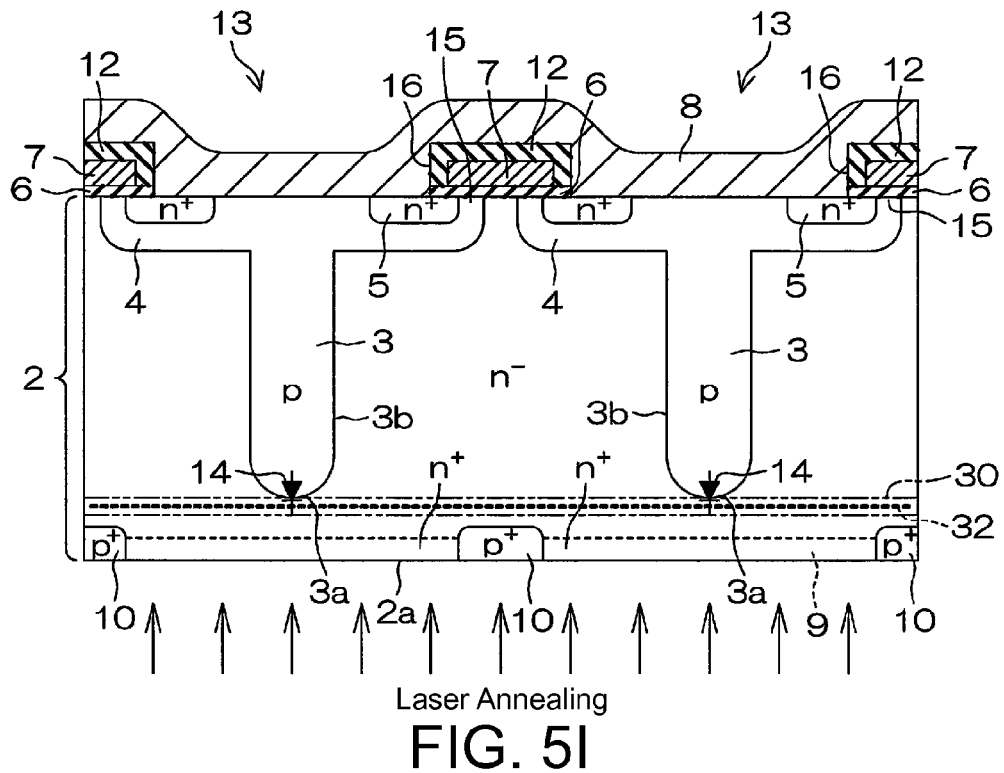
FIG. 5I illustrates a manufacturing step that follows the step shown in FIG. 5H.

Next, as shown in FIG. 5I, laser annealing is conducted to the n$^-$-type base layer 2, thereby activating the B ions and BF$_2$ ions injected in the previous steps. As a result, portions of the n$^+$-type contact layer 9 are inverted from n-type to p-type, thereby forming p$^+$-type collector layers 10.

Because high temperature annealing (about 1500° C., for example) is not conducted here, the source electrode 8 is not melted. That is, metallic elements that are likely to melt at high temperatures such as the source electrode 8 and the like can be fabricated prior to this annealing process. This allows most of or all of the elements provided on the front surface side of the n$^-$-type base layer 2 to be formed before the annealing process. Because this eliminates a need to flip over the n$^-$-type base layer 2 many times, the manufacturing efficiency can be improved.

Figure 5J:
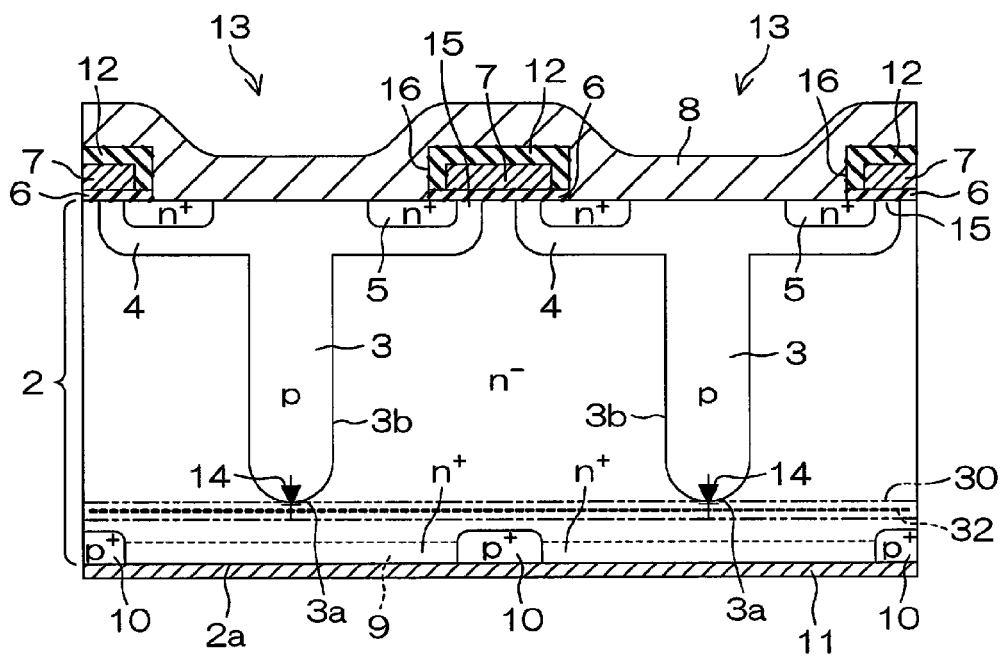
FIG. 5J illustrates a manufacturing step that follows the step shown in FIG. 5I.

Next, as shown in FIG. 5J, the drain electrode 11 is formed on the rear surface 2a of the n$^-$-type base layer 2, and as necessary, heat treatment for alloying is conducted to achieve an ohmic contact. The drain electrode 11 may be formed by depositing Ti, Ni, Au, and Ag in this order by sputtering.

The semiconductor device 1 shown in FIG. 1 can be obtained through the above-mentioned steps.

Figure 6:
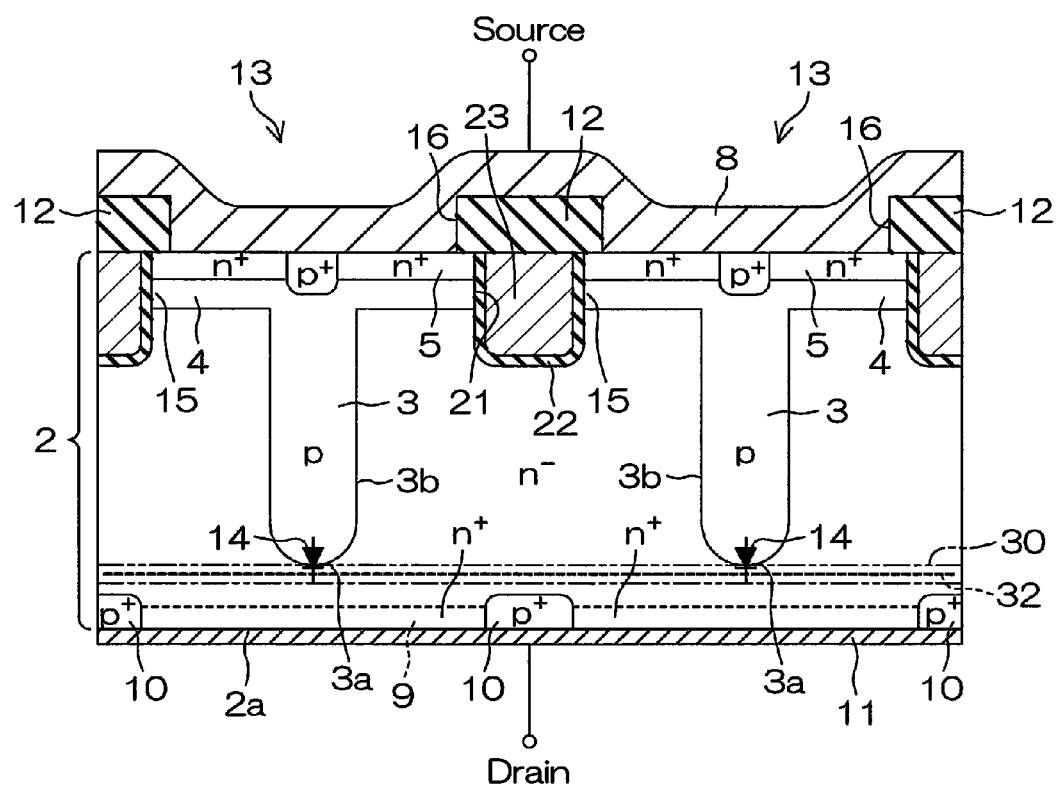
FIG. 6 shows a modification example of the gate structure shown in FIG. 1.

The semiconductor device 1 may have a trench-gate structure as shown in FIG. 6, for example. Specifically, the semiconductor device 1 may have a trench-gate structure in which a gate trench 21 is formed in the front surface portion of the n$^-$-type base layer 2 so as to penetrate the n$^+$-type source layer 5 and the p-type base layer 4, and a gate electrode 23 is formed to fill the gate trench 21 with a gate insulating film 22 interposed therebetween.

Figure 7:
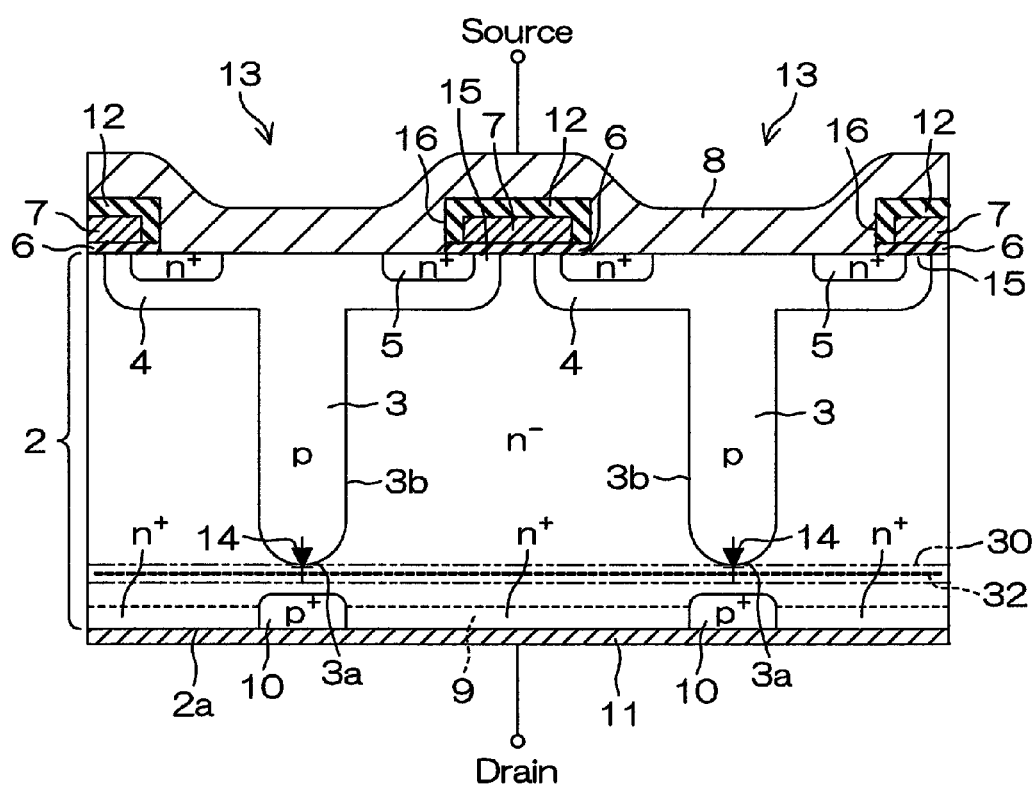
FIG. 7 shows a modification example of the arrangement of the $p^+$-type collector layer shown in FIG. 1.

The p$^+$-type collector layers 10 may also be located immediately below the p-type column layers 3, as shown in FIG. 7, and may face the p-type column layers 3 in the thickness direction of the n$^-$-type base layer 2.

As shown in FIGS. 5A to 5C, in the description above, the p-type column layers 3 were obtained by forming a plurality of n-type semiconductor layers 19 on the initial base layer 18 by multiple epitaxial growth while injecting a p-type impurity, and thereafter conducting annealing. However, alternatively, the p-type column layers 3 may be formed through steps shown in FIGS. 8A to 8D, for example.

Figure 8A:
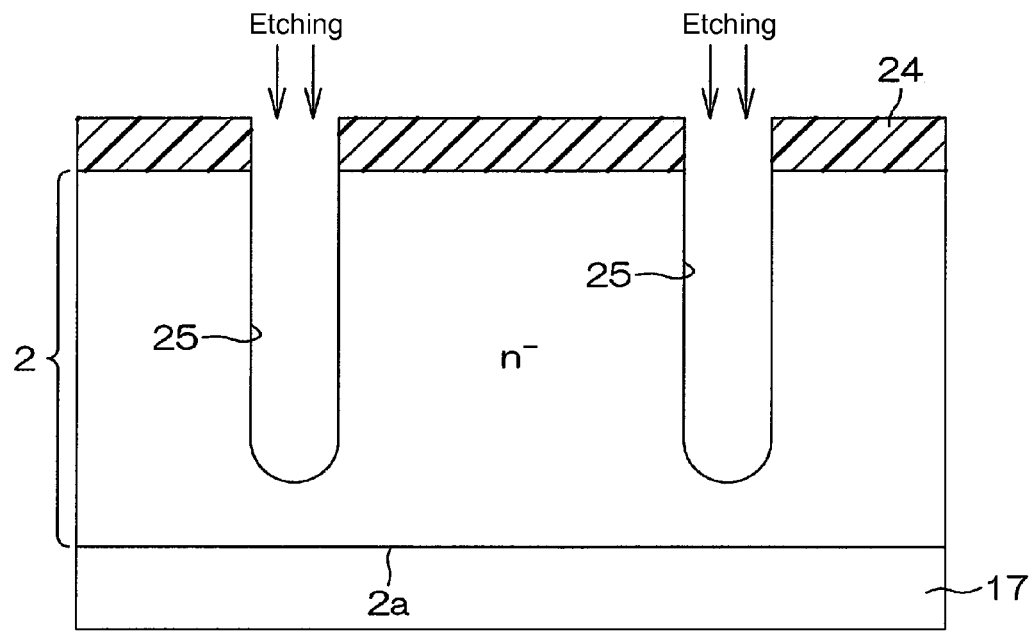
FIG. 8A shows a modification example of the manufacturing process of the p-type column layer shown in FIG. 1.

Specifically, first, on a substrate 17, an n$^-$-type base layer 2 is formed by epitaxial growth. Next, as shown in FIG. 8A, a hard mask 24 is formed on the n$^-$-type base layer 2. After patterning the hard mask 24, the n$^-$-type base layer 2 is dry-etched through the hard mask 24. This way, trenches 25 are formed in the n$^-$-type base layer 2.

Figure 8B:
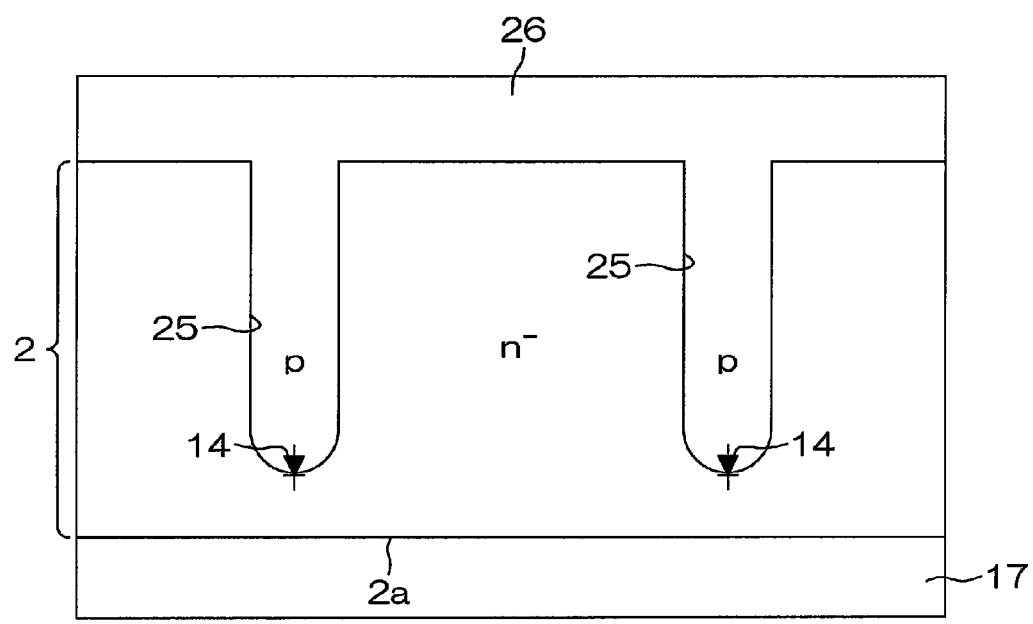
FIG. 8B illustrates a manufacturing step that follows the step shown in FIG. 8A.

Next, as shown in FIG. 8B, after removing the hard mask 24, a p-type semiconductor layer 26 is formed by epitaxial growth so as to fill the trenches 25 and cover the front surface of the n$^-$-type base layer 2.

Figure 8C:
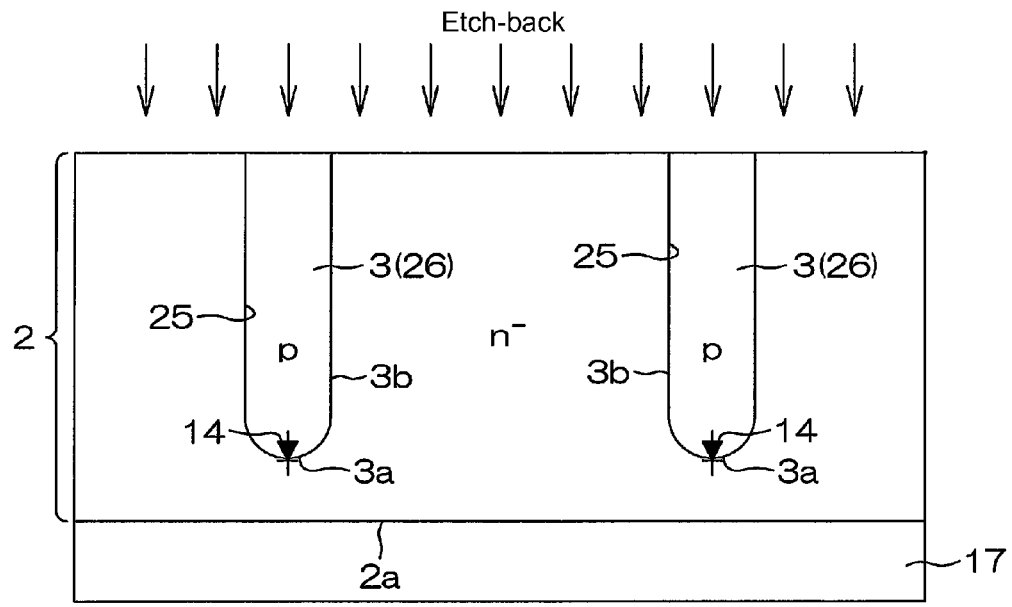
FIG. 8C illustrates a manufacturing step that follows the step shown in FIG. 8B.

Next, as shown in FIG. 8C, the p-type semiconductor layer 26 covering the front surface of the n$^-$-type base layer 2 outside the trenches 25 is removed by etch-back. This way, the p-type column layers 3 embedded in the trenches 25 are formed.

Figure 8D:
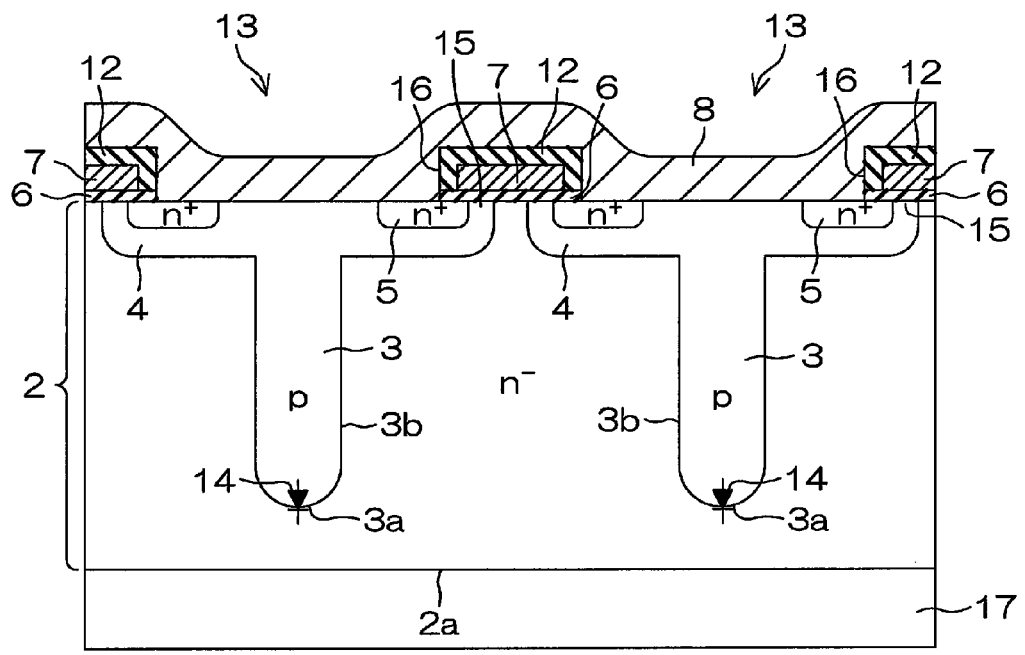
FIG. 8D illustrates a manufacturing step that follows the step shown in FIG. 8C.

Next, as shown in FIG. 8D, steps similar to those shown in FIG. 5C are conducted. The subsequent steps may be similar to those shown in FIGS. 5D to 5H.

Figure 9:
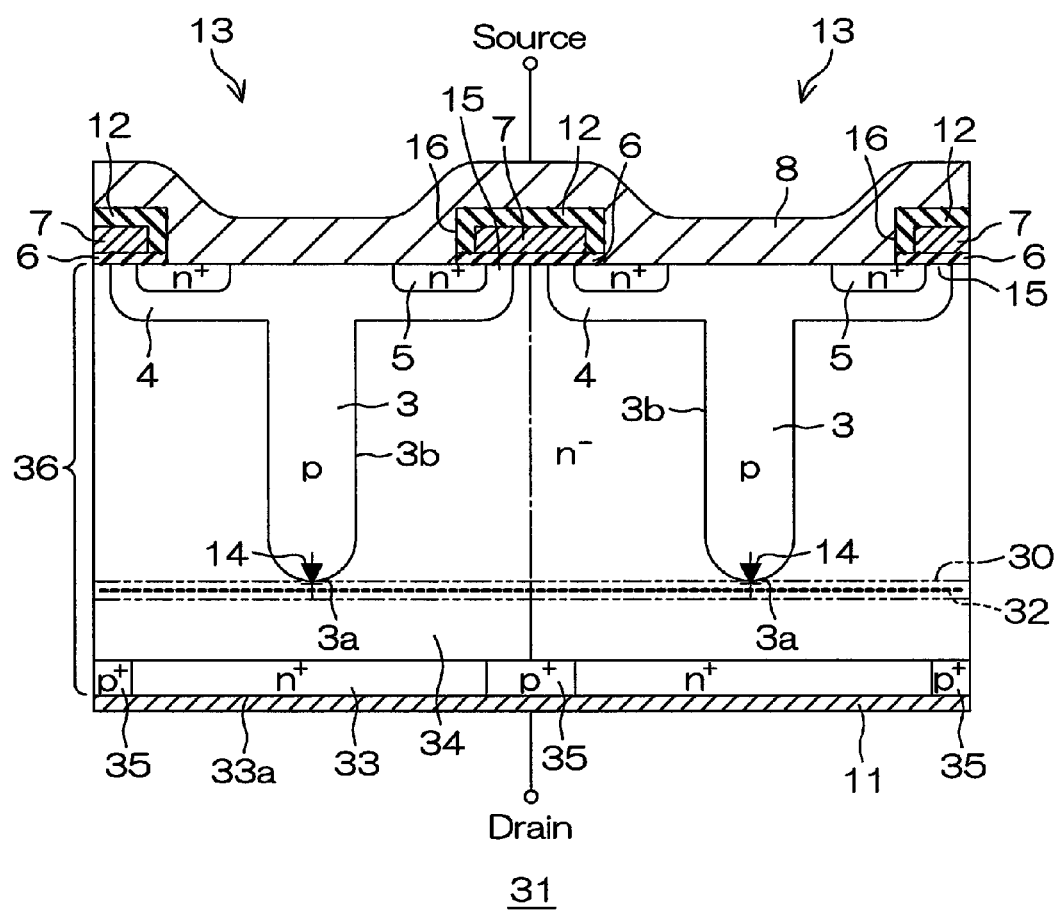
FIG. 9 is a schematic cross-sectional view of a semiconductor device according to Embodiment 2 of the present invention.

FIG. 9 is a schematic cross-sectional view of a semiconductor device according to Embodiment 2 of the present invention. In FIG. 9, portions that correspond to the respective portions shown in FIG. 1 are given the same reference characters.

In the semiconductor device 1 shown in FIG. 1 described above, the n-type (first conductive type) base layer was formed as a single layer of the n$^-$-type base layer 2, and the n$^+$-type contact layer 9 was formed in the rear surface 2a portion by ion implantation. However, as shown in FIG. 9, the n-type base layer may have a multi-layer structure of an n$^+$-type substrate 33 (lower layer) and an n$^-$-type drift layer 34 (upper layer). In an n-type base layer 36, the n$^-$-type drift layer 34 has a relatively low impurity concentration, and the n$^+$-type substrate 33 has a relatively high impurity concentration. In this configuration, the n$^+$-type substrate 33 supports the n$^-$-type drift layer 34 and also serves as the n$^+$-type contact layer 9 described above.

The p$^+$-type collector layers 35 are formed on the rear surface 33a of the n$^+$-type substrate 33 in the lower layer so as to penetrate the n$^+$-type substrate 33 in the thickness direction and reach the rear surface of the n$^-$-type drift layer 34. The p$^+$-type collector layers 35 are exposed from the rear surface 33a of the n$^+$-type substrate 33. The impurity concentration and the shape of the p$^+$-type collector layers 35 are the same as those of the p$^+$-type collector layers 10 described above.

Figure 10A:
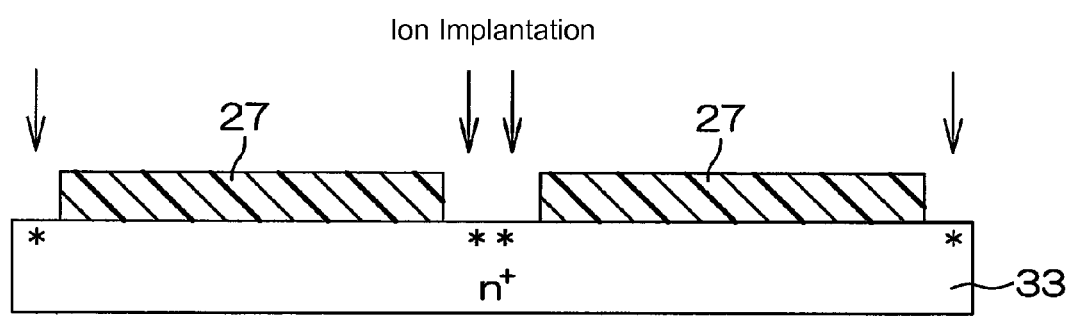
FIG. 10A illustrates a part of a manufacturing process of the semiconductor device shown in FIG. 9.

In manufacturing this semiconductor device 31, first, as shown in FIG. 10A, a photoresist 27 is formed on the n$^+$-type substrate 33 (n$^+$-type silicon substrate, for example) so as to selectively expose the surface of the n$^+$-type substrate 33. Thereafter, ion implantation with a p-type impurity is performed from above this photoresist 27. The ion implantation can be conducted in the same manner as the step shown in FIG. 5H. After the ion implantation, the photoresist 27 is removed by ashing, for example.

Figure 10B:
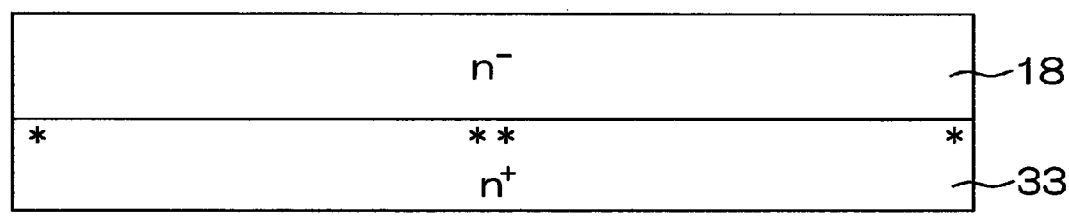
FIG. 10B illustrates a manufacturing step that follows the step shown in FIG. 10A.
Figure 10C:
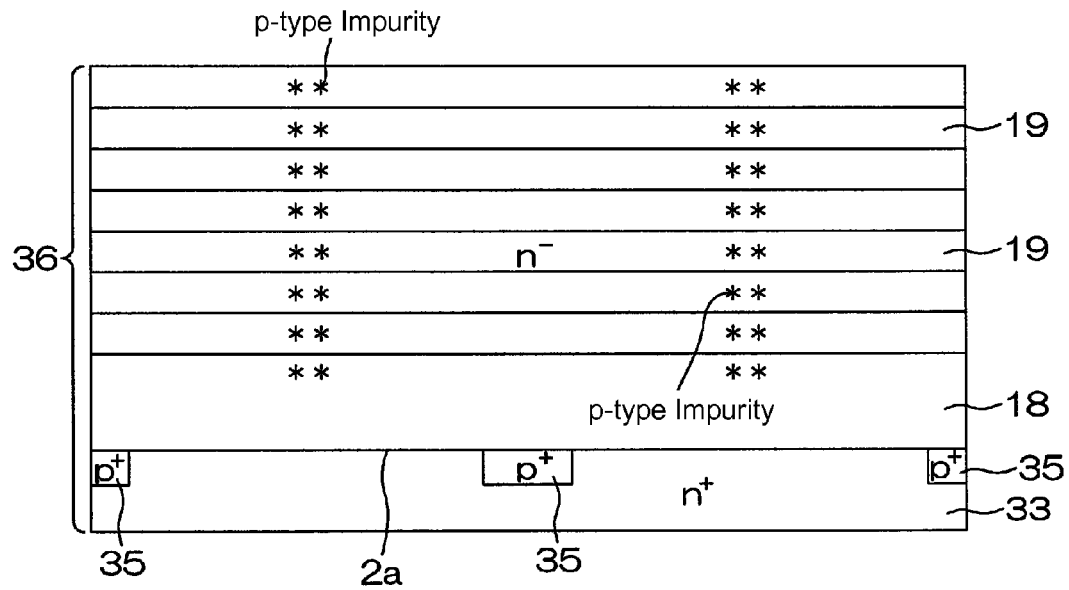
FIG. 10C illustrates a manufacturing step that follows the step shown in FIG. 10B.

Next, as shown in FIGS. 10B and 10C, in a manner similar to the steps shown in FIGS. 5A and 5B, the initial base layer 18 is formed on the n⁺-type substrate 33, and thereafter, the n⁻-type drift layer 34 is formed by laminating a plurality of n-type semiconductor layers 19. This way, the n-type base layer 36 made of the n⁺-type substrate 33 and the n⁻-type drift layer 34 is formed.

Figure 10D:
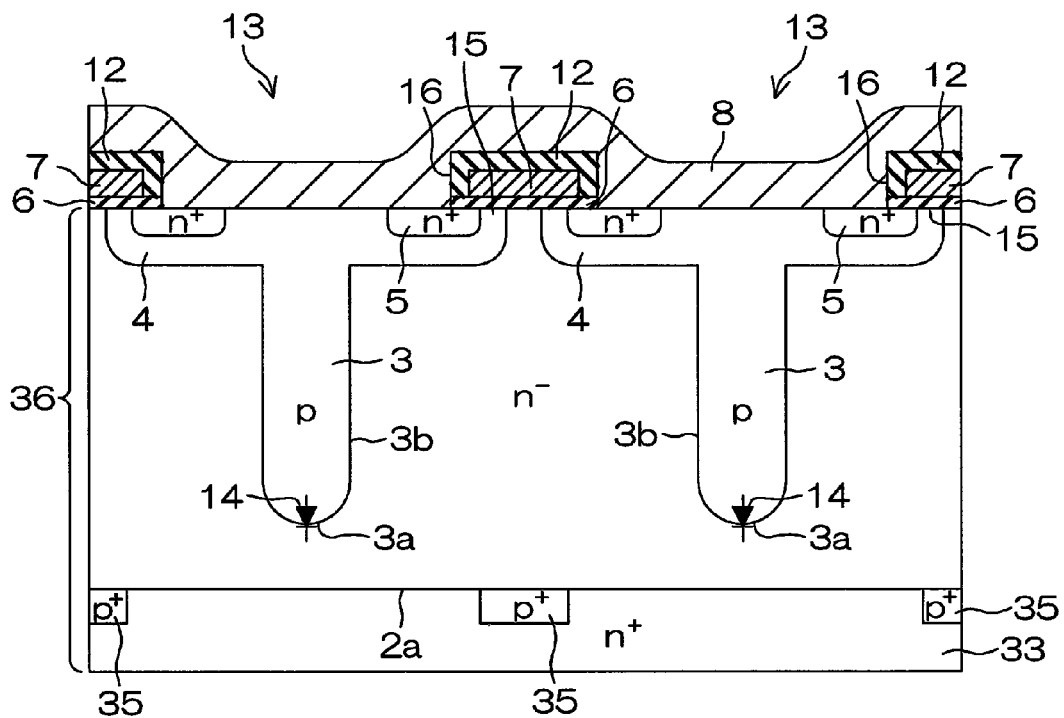
FIG. 10D illustrates a manufacturing step that follows the step shown in FIG. 10C.

Next, as shown in FIG. 10D, by conducting drive-in annealing (1000° C. to 1200° C.), the p-type impurity in the plurality of n-type semiconductor layers 19 and the p-type impurity in the n⁺-type substrate 33 are diffused. As a result, the p-type column layers 3 and the p⁺-type collector layers 35 are simultaneously formed. Next, in a manner similar to the process shown in FIG. 5C, the p-type base layers 4, the n⁺-type source layers 5, the gate insulating film 6, the gate electrode 7, and the like are formed.

Figure 10E:
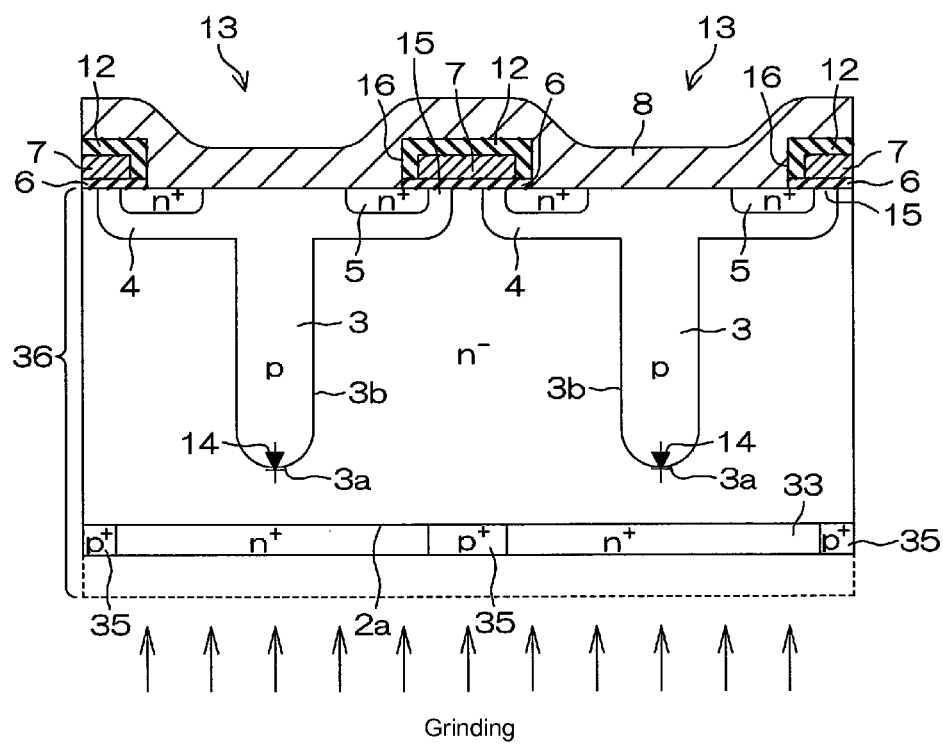
FIG. 10E illustrates a manufacturing step that follows the step shown in FIG. 10D.

Next, as shown in FIG. 10E, in a manner similar to the step shown in FIG. 5D, the n⁺-type substrate 33 is ground from the rear surface 33a side by using a grinder or the like. This grinding is continued until the p⁺-type collector layers 35 are exposed from the rear surface 33a of the n⁺-type substrate 33. After grinding, spin-etching is conducted to the rear surface 33a of the n⁺-type substrate 33, thereby polishing the rear surface 33a of the n⁺-type substrate 33 for mirror-finish.

Thereafter, steps similar to those shown in FIGS. 5E to 5J (except for the steps shown in FIGS. 5G to 5I) are performed, thereby obtaining the semiconductor device 31.

In this method, the n-type base layer 36 has a multi-layer structure of the n⁺-type substrate 33 and the n⁻-type drift layer 34. Because the n⁻-type drift layer 34 is supported by the n⁺-type substrate 33 until the end of the manufacturing process of the semiconductor device 31, transfer and handling of the n-type base layer 36 is made easier.

Also, because the n⁺-type substrate 33, which is a base of the n-type base layer 36, is used as the n⁺-type contact layer 9 described in Embodiment 1 above, the ion implantation process shown in FIG. 5G can be omitted. As a result, the manufacturing process can be simplified.

Figure 11:
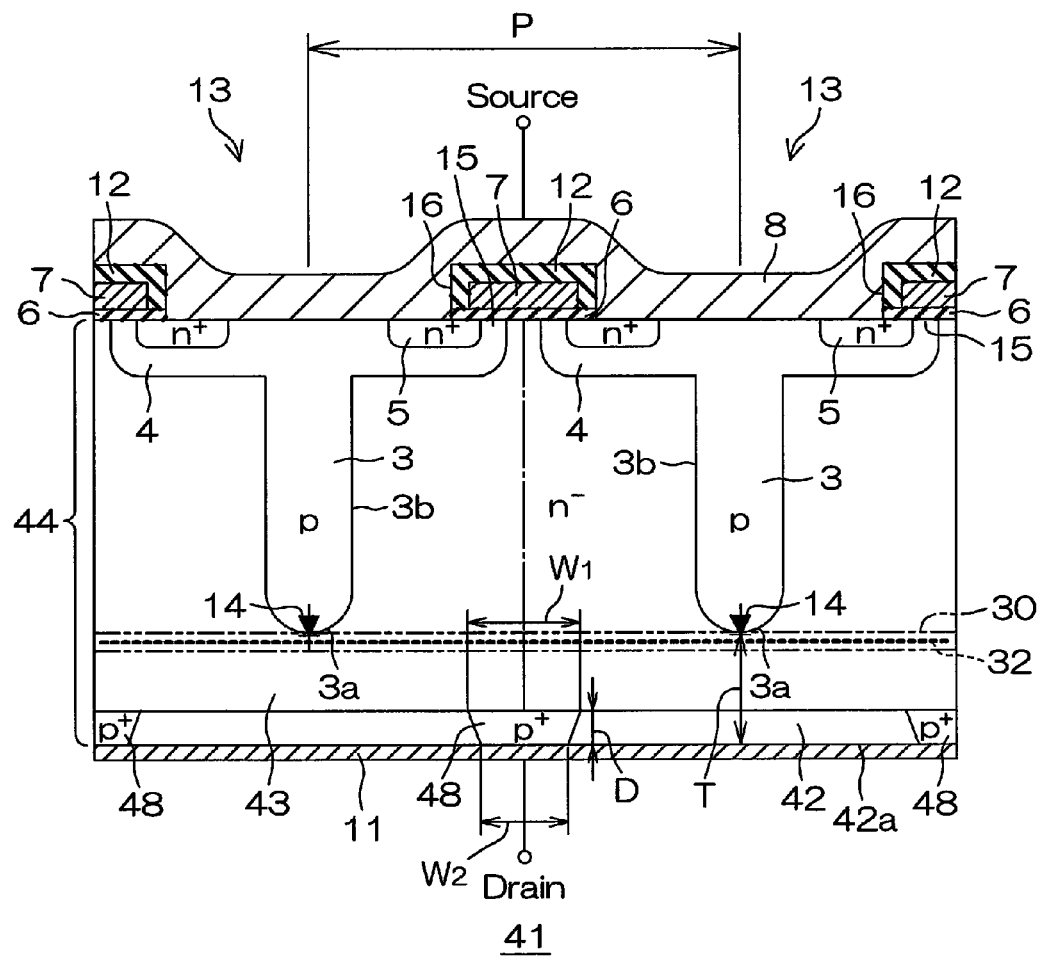
FIG. 11 is a schematic cross-sectional view of a semiconductor device according to Embodiment 3 of the present invention.

FIG. 11 is a schematic cross-sectional view of a semiconductor device according to Embodiment 3 of the present invention. In FIG. 11, corresponding portions to the respective portions in FIG. 1 are given the same reference characters.

In the semiconductor device 1 shown in FIG. 1 described above, the n-type (first conductive type) base layer was formed as a single layer of the n⁻-type base layer 2, and the n⁺-type contact layer 9 was formed in the rear surface 2a portion by ion implantation. However, as shown in FIG. 11, the n-type base layer may have a multi-layer structure of an n⁺-type substrate 42 (lower layer) and an n⁻-type drift layer 43 (upper layer). In the n-type base layer 44, the n⁻-type drift layer 43 has a relatively low impurity concentration, and the n⁺-type substrate 42 has a relatively high impurity concentration. In this configuration, the n⁺-type substrate 42 supports the n⁻-type drift layer 43 and also serves as the n⁺-type contact layer 9 described above.

In a manner similar to the p⁺-type collector layers 35 in Embodiment 2 described above, p⁺-type collector layers 48 are formed on the rear surface 42a of the n⁺-type substrate 42 in the lower layer so as to penetrate the n⁺-type substrate 42 in the thickness direction and reach the rear surface of the n⁻-type drift layer 43. The p⁺-type collector layers 48 are also exposed from the rear surface 42a of the n⁺-type substrate 42. However, the p⁺-type collector layers 48 differ from the p⁺-type collector layers 35 in that the p⁺-type collector layers 48 have a tapered shape that becomes narrower from the rear surface of the n⁻-type drift layer 43 toward the rear surface 42a of the n⁺-type substrate 42. That is, the p⁺-type collector layers 48 have a tapered shape in which the width $W_2$ of the portion thereof that is exposed from the rear surface 42a of the n⁺-type substrate 42 is smaller than the width $W_1$ of the portion thereof that makes contact with the rear surface of the n⁻-type drift layer 43 ($W_1 > W_2$). Also, the p⁺-type collector layers 48 differ from the p⁺-type collector layers 35 in that the impurity concentration thereof is uniform in both directions along and orthogonal to the rear surface 42a of the n⁺-type substrate 42 within a range of $1 \times 10^{17}$ cm⁻³ to $1 \times 10^{22}$ cm⁻³.

Figure 12A:
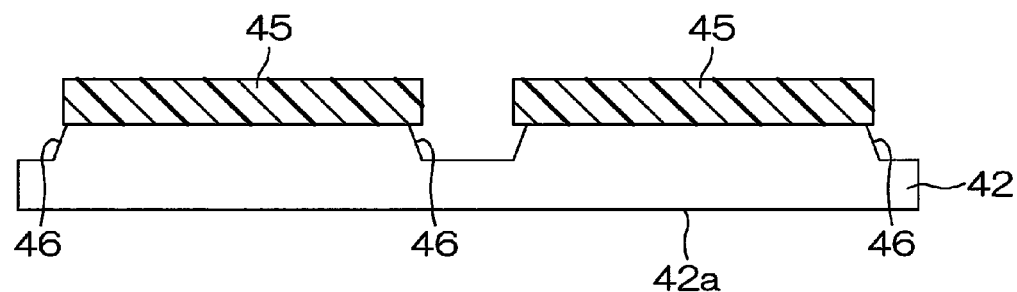
FIG. 12A illustrates a part of a manufacturing process of the semiconductor device shown in FIG. 11.

In manufacturing this semiconductor device 41, first, as shown in FIG. 12A, a photoresist 45 is formed on the n⁺-type substrate 42 (n⁺-type silicon substrate, for example) so as to selectively expose the front surface of the n⁺-type substrate 42. Thereafter, the n⁺-type substrate 42 undergoes dry-etching through the photoresist 45. In this dry-etching, the n⁺-type substrate 42 is isotropically etched from the front surface thereof toward the rear surface 42a. As a result, in portions where the p⁺-type collector layers 48 are to be disposed, trenches 46 having a tapered shape that becomes narrower from the opening edge toward the bottom are formed.

Figure 12B:
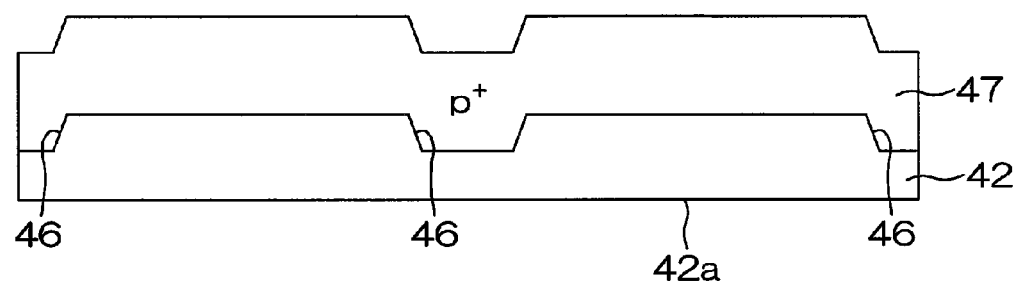
FIG. 12B illustrates a manufacturing step that follows the step shown in FIG. 12A.

Next, as shown in FIG. 12B, a p⁺-type semiconductor layer 47 is formed on the substrate 17 by epitaxial growth while injecting a p-type impurity thereto. The p⁺-type semiconductor layer 47 is grown at least until the trenches 46 are filled and the surface of the n⁺-type substrate 42 is covered.

Figure 12C:
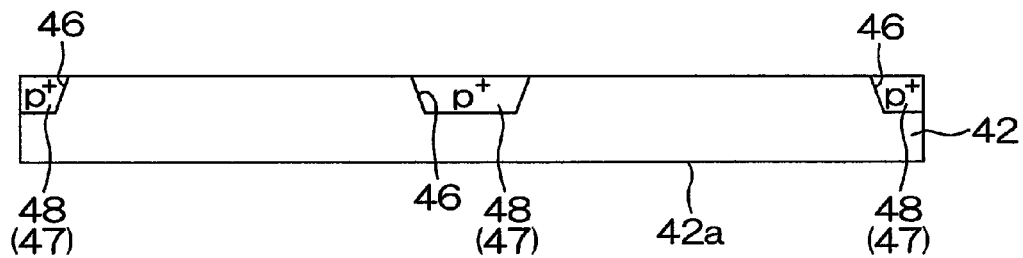
FIG. 12C illustrates a manufacturing step that follows the step shown in FIG. 12B.

Next, as shown in FIG. 12C, by CMP process, the p⁺-type semiconductor layer 47 on the surface of the n⁺-type substrate 42 is removed by grinding. As a result, the p⁺-type collector layers 48 are made of the p⁺-type semiconductor layer 47 remaining in the trenches 46.

Figure 12D:
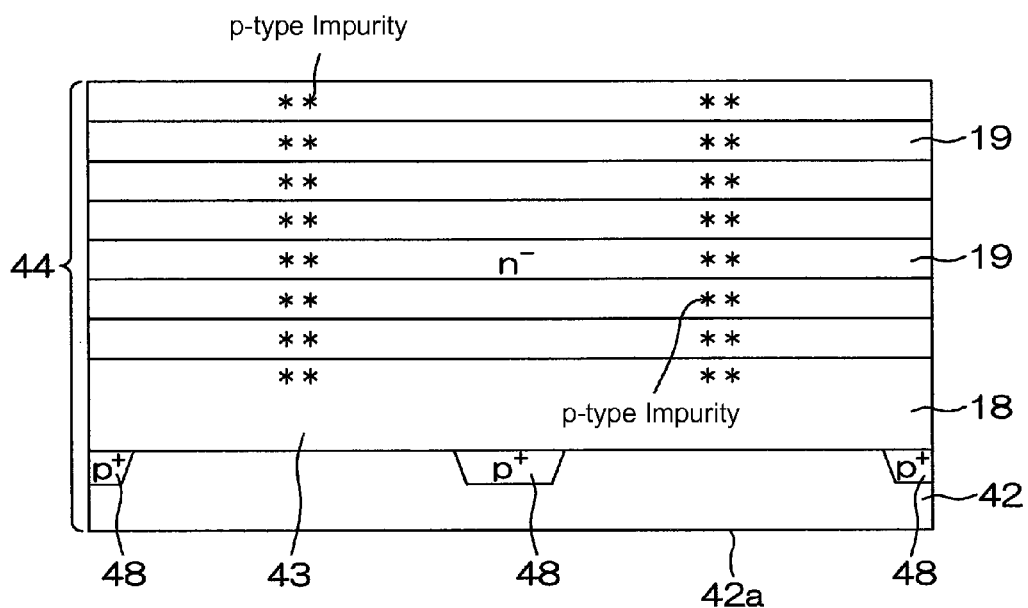
FIG. 12D illustrates a manufacturing step that follows the step shown in FIG. 12C.

Next, as shown in FIG. 12D, in a manner similar to the steps shown in FIGS. 5A and 5B, the initial base layer 18 is formed on the n⁺-type substrate 42, and thereafter, the n⁻-type drift layer 43 is formed by laminating a plurality of n-type semiconductor layers 19. This way, the n-type base layer 44 made of the n⁺-type substrate 42 and the n⁻-type drift layer 43 is formed.

Figure 12E:
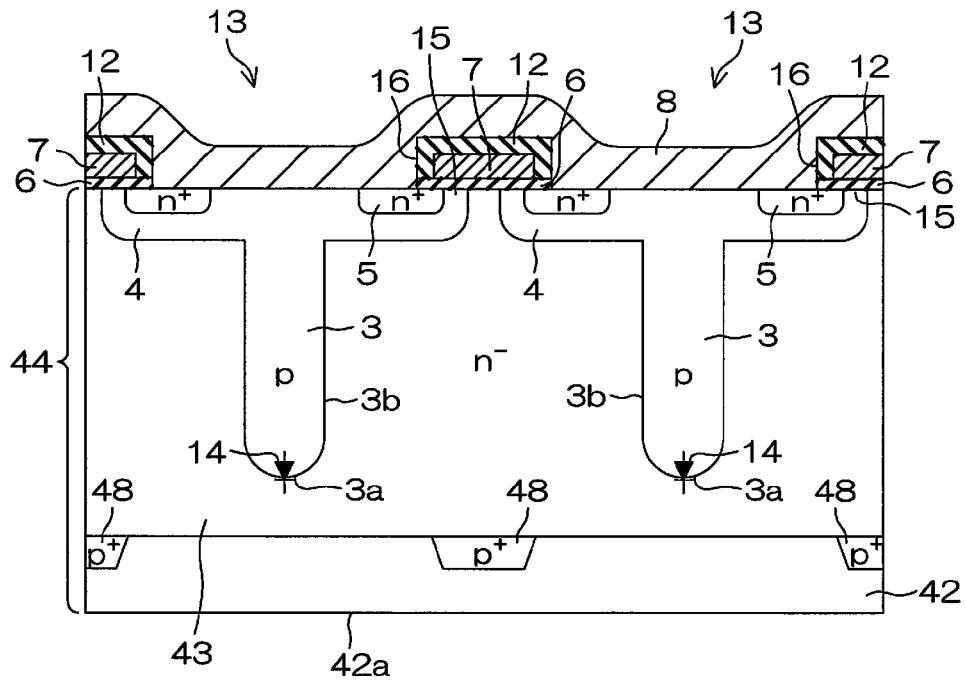
FIG. 12E illustrates a manufacturing step that follows the step shown in FIG. 12D.

Next, as shown in FIG. 12E, by conducting drive-in annealing (1000° C. to 1200° C.), the p-type impurity in the plurality of n-type semiconductor layers 19 is diffused. As a result, p-type column layers 3 are formed. Next, in a manner similar to the process shown in FIG. 5C, the p-type base layers 4, the n⁺-type source layers 5, the gate insulating film 6, the gate electrode 7, and the like are formed.

Figure 12F:
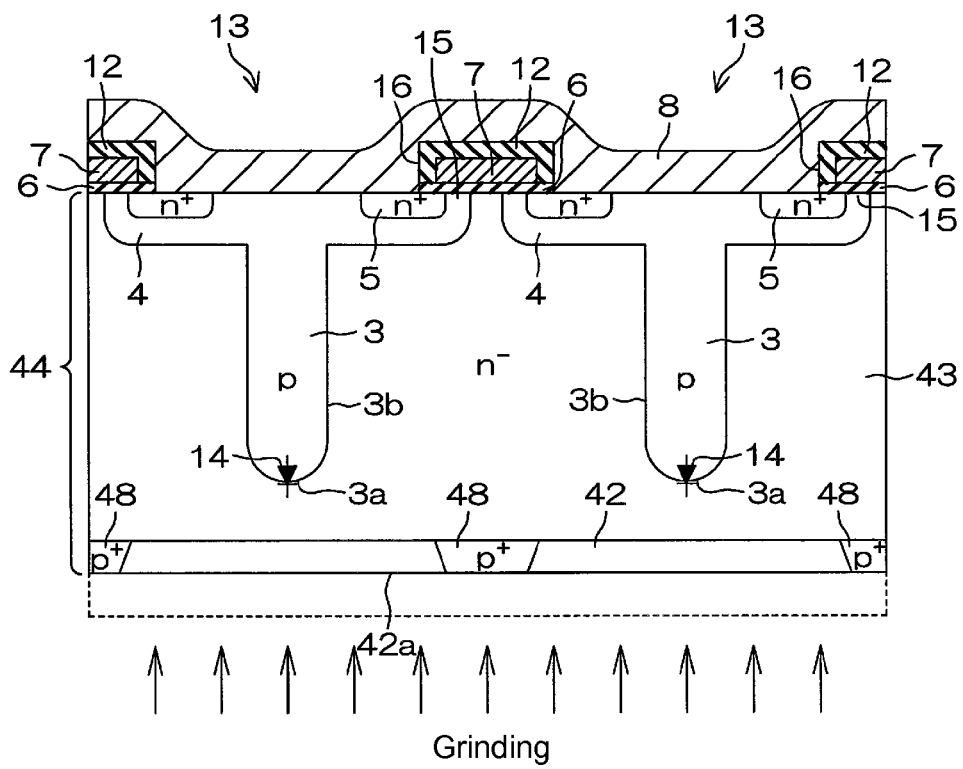
FIG. 12F illustrates a manufacturing step that follows the step shown in FIG. 12E.

Next, as shown in FIG. 12F, in a manner similar to the step shown in FIG. 5D, the n⁺-type substrate 42 is ground from the rear surface 42a side by using a grinder, for example. This grinding is continued until the p⁺-type collector layers 48 are exposed from the rear surface 42a of the n⁺-type substrate 42. After grinding, spin-etching is conducted to the rear surface 42a of the n⁺-type substrate 42 for mirror-finish.

Thereafter, steps similar to those shown in FIGS. 5E to 5J (except for the steps shown in FIGS. 5G to 5I) are performed, thereby obtaining the semiconductor device 41.

With this method, in a manner similar to Embodiment 2 above, the n-type base layer 44 has a multi-layer structure of the n⁺-type substrate 42 and the n⁻-type drift layer 43. Because the n⁻-type drift layer 43 is supported by the n⁺-type substrate 42 until the semiconductor device 41 is completed, transfer and handling of the n-type base layer 44 is made easier.

Also, because the n⁺-type substrate 42, which is a base of the n-type base layer 44, is used as the n⁺-type contact layer 9 described in Embodiment 1 above, the ion implantation step shown in FIG. 5G can be omitted. As a result, the manufacturing process can be simplified.

Further, because the p+-type collector layers 48 are formed by epitaxial growth, the impurity concentration of the p+-type collector layers 48 can be made uniform in the entire layers.

Embodiments of the present invention were described above, but the present invention can also be implemented as other embodiments. For example, one or both of the depletion layer stopper region 30 and the trap level region 32 may be omitted.

In the embodiments described above, examples in which the p-type base layer 4 and the like have a rectangular shape (FIG. 2), a hexagonal shape (FIG. 3), or a strip shape in a plan view were shown. However, the plan view shape of the p-type base layer 4 and the like is not limited to such, and may be a circle, an oval, a pentagon, or a polygon of heptagon or more.

It is also possible to employ a configuration in which the conductive types of the respective semiconductor portions of the semiconductor devices 1, 31, and 41 are reversed. For example, in the semiconductor device 1, the p-type portions may be n-type portion, and the n-type portions may be p-type portions.

In addition to these embodiments, various design modifications can be made without departing from the scope of claims.

Working Examples

Next, simulations conducted to verify effects of certain aspects of the present invention will be explained. Simulations 1 to 3 below were conducted using semiconductor devices 1 that do not include the depletion layer stopper region 30 or the trap level region 32. As far as the simulated characteristics are concerned, these two regions do not substantively affect the results of Simulations 1 to 3.

<Simulation 1>

In Simulation 1, the dependence of breakdown voltages on the thickness T of the n−-type base layer 2 immediately below the p-type column layer 3 was studied. In Simulation 1, a plurality of semiconductor devices 1 in which the thickness T of the n−-type base layer 2 immediately below the p-type column layer 3 was set to different values, i.e., 18 μm, 30 μm, and 40 μm, were prepared.

For each thickness T, five different samples were prepared. One sample is not provided with the p+-type collector layers 10 (no B ion implanted) and the other four samples are provided with the p+-type collector layers 10. Further, those four samples were made to differ from each other with respect to the dosage of B ions and presence or absence of a mask on the p+-type collector layers 10 as follows: (1) B ion $1.0\times10^{13}$ cm$^{-2}$ (with mask); (2) B ion $1.0\times10^{14}$ cm$^{-2}$ (with mask); (3) B ion $1.0\times10^{15}$ cm$^{-2}$ (with mask); and (4) B ion $1.0\times10^{15}$ cm$^{-2}$ (without mask).

The mask on the p+-type collector layers 10 is provided to cover parts of the p+-type collector layers 10 such that no current flows therein.

Figure 13:
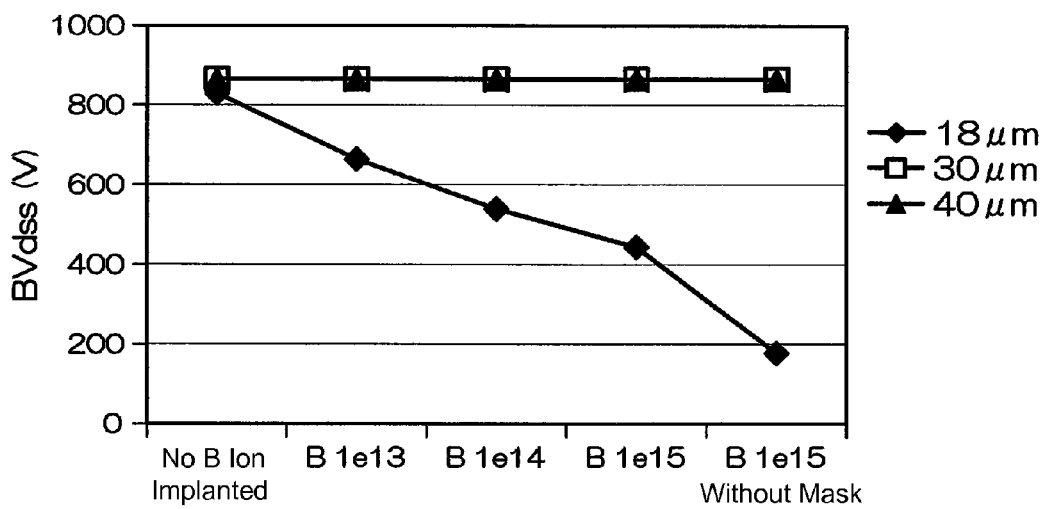
FIG. 13 is a graph showing breakdown voltages of the semiconductor device for respective thicknesses of the n⁻-type base layer immediately below the p-type column layer.
Figure 14:
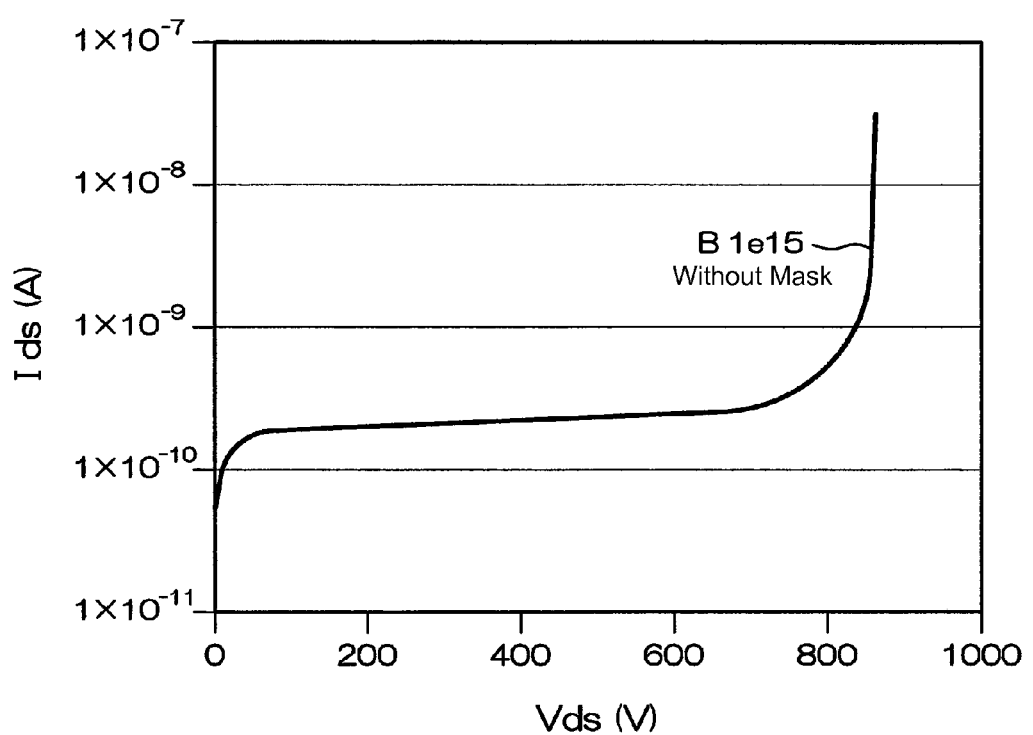
FIG. 14 is a chart showing a breakdown voltage waveform when the thickness of the n⁻-type base layer below the p-type column layer is 30 μm.
Figure 15:
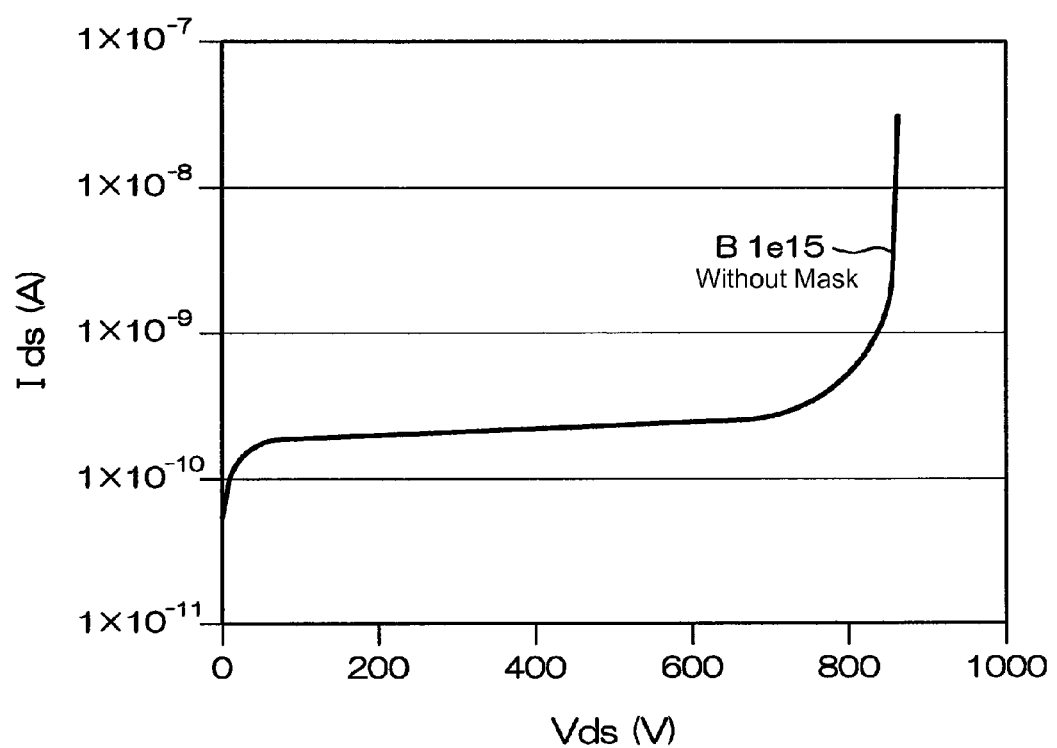
FIG. 15 is a chart showing a breakdown voltage waveform when the thickness of the n⁻-type base layer below the p-type column layer is 40 μm.

The breakdown voltages of the respective semiconductor devices were measured by applying a test current $I_{ds}=1\times10^{-9}$ A. The results are shown in FIG. 13. FIG. 13 shows that when the thickness T of the n−-type base layer 2 immediately below the p-type column layer 3 is 30 μm or greater, a breakdown voltage of 800V or higher can be ensured regardless of the presence of the p+-type collector layers 10. FIGS. 14 and 15 respectively show breakdown voltage waveforms when the thickness T of the n−-type base layer 2 immediately below the p-type column layer 3 is 30 μm and when the thickness T is 40 μm.

Figure 16A:
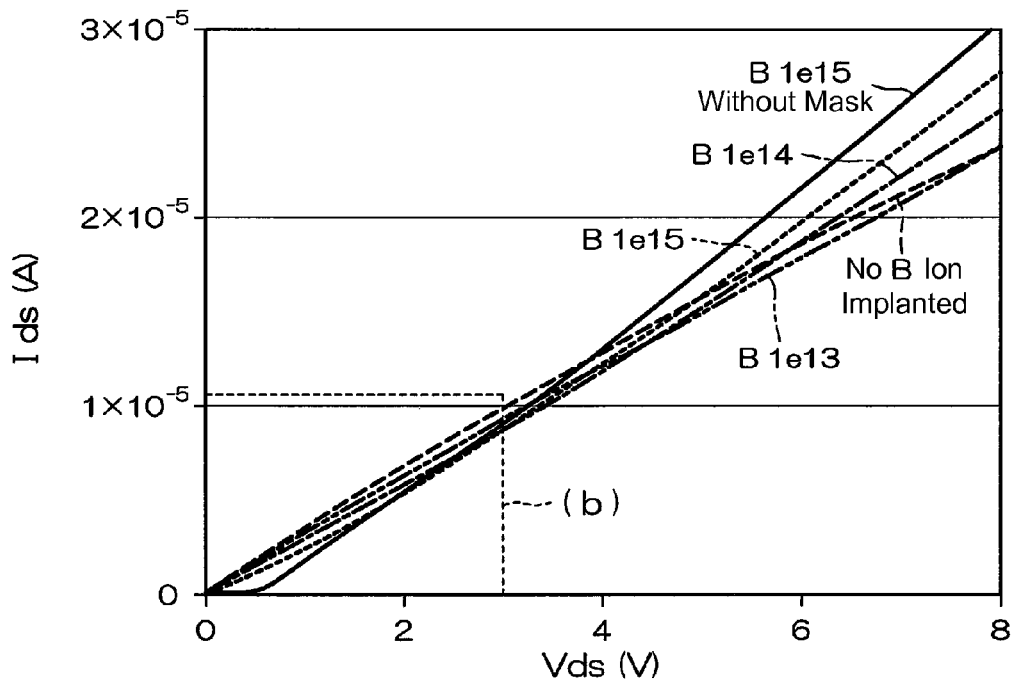
FIGS. 16A and 16B are graphs showing Id-Vd characteristics when the thickness of the n⁻-type base layer below the p-type column layer is 30 μm.
Figure 16B:
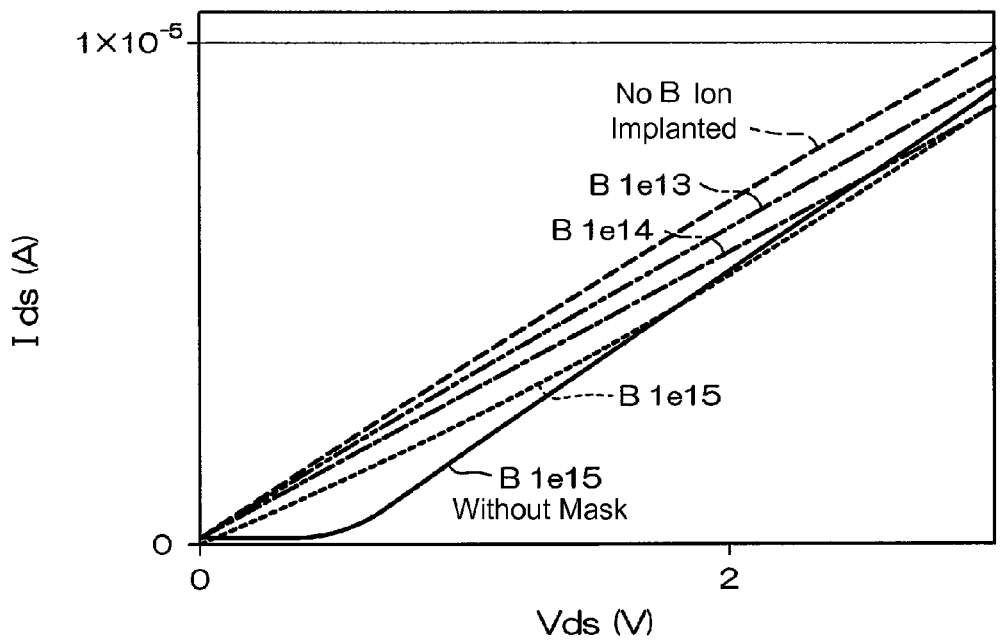
Figure 17A:
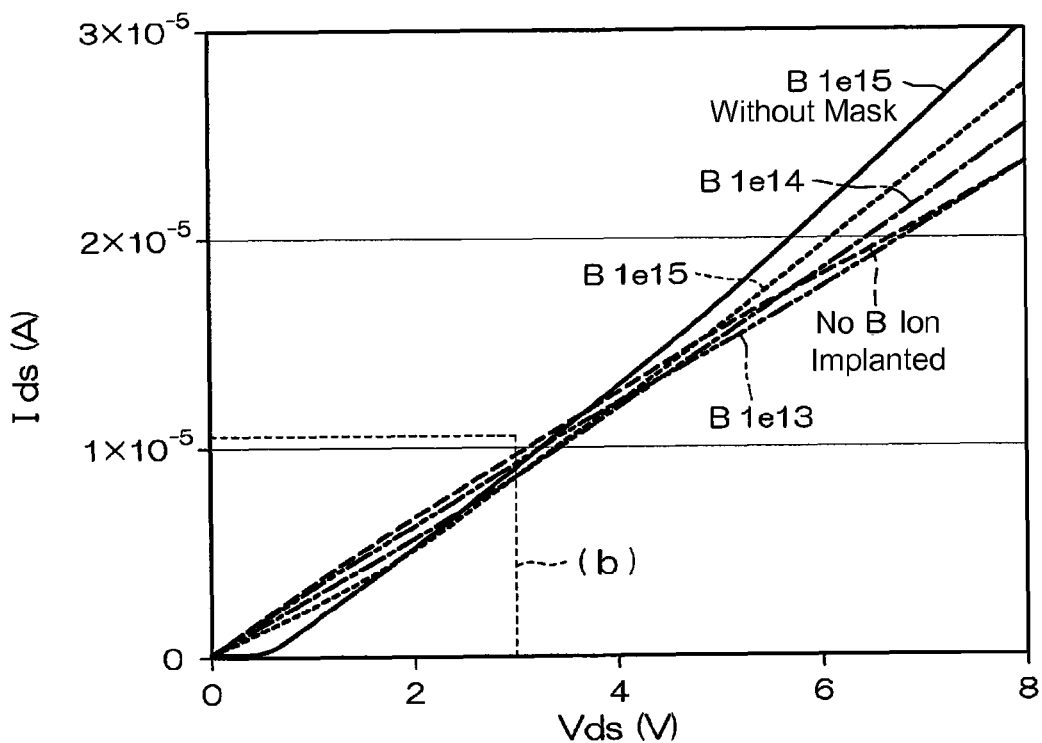
FIGS. 17A and 17B are graphs showing Id-Vd characteristics when the thickness of the n⁻-type base layer below the p-type column layer is 40 μm.
Figure 17B:
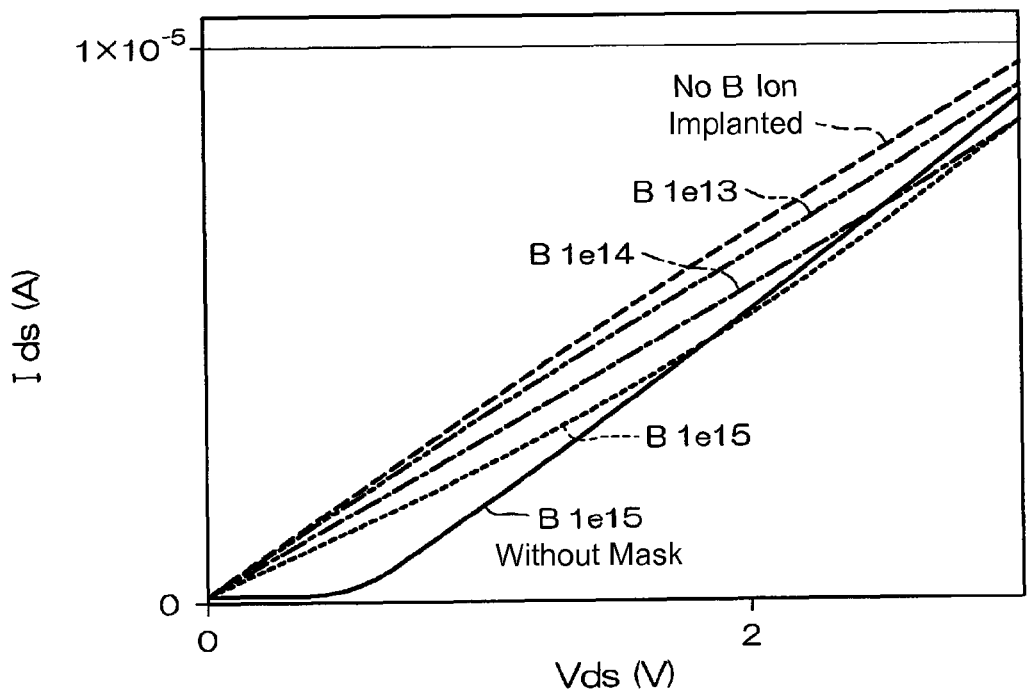

FIGS. 16 and 17 respectively show Id-Vd characteristics when the thickness T of the n−-type base layer 2 immediately below the p-type column layer 3 is 30 μm and when the thickness T is 40 μm.

As shown in FIGS. 16 and 17, in the semiconductor devices in which the p+-type collector layers 10 (without mask) are formed, the efficiency in high current operations is improved as compared with the semiconductor devices in which the p+-type collector layers 10 are not formed (or are covered with the mask).

<Simulation 2>

Simulation 2 was conducted to study changes in current characteristics caused by the p+-type collector layers 10. In Simulation 2, semiconductor devices 1 in which the thickness T of the n−-type base layer 2 immediately below the p-type column layer 3 was set to 40 μm were prepared.

Also, in forming the p+-type collector layers 10, because ion implantation cannot be performed to the rear surface 2a of the n−-type base layer 2 in the simulation, ion implantation and annealing were conducted from the front surface side instead. The conditions for the ion implantation and laser annealing were set as follows:

ion implantation: B ion, 100 keV, $1\times10^{15}$ cm$^{-2}$, 2 degrees; annealing: 1000° C., 10 seconds.

Figures 18A, 18B:
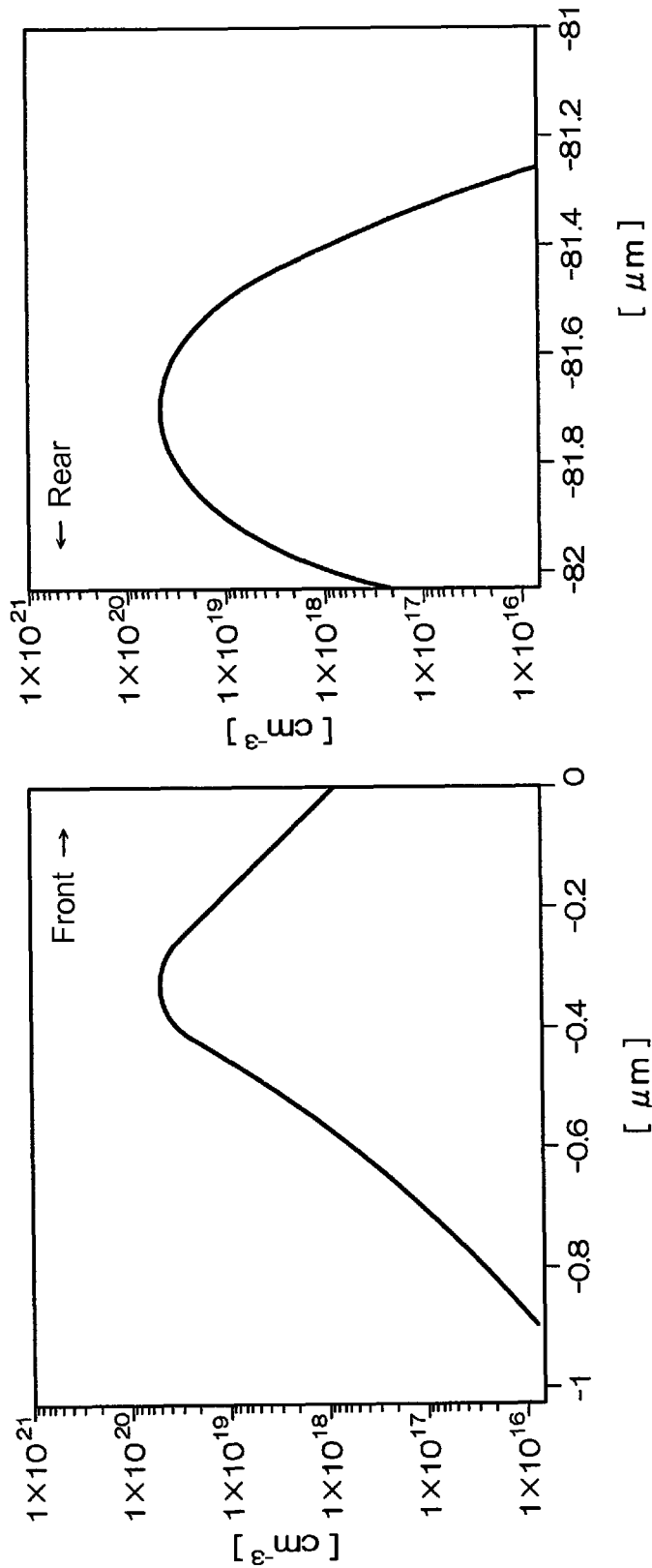
FIG. 18A is a profile near the front surface.
FIG. 18B is a profile near the rear surface obtained based on the concentration distribution of FIG. 18A.

FIG. 18A shows the resultant concentration distribution of boron. Based on the profile shown in FIG. 18A, the concentration of boron near the rear surface 2a of the n−-type base layer 2 was set as shown in FIG. 18B. The conditions of the p+-type collector layers 10 were set as follows:

width W of the p+-type collector layers 10: 0 to 19.5 μm, when the width is 19.5 μm, the entire rear surface 2a of the n−-type base layer 2 becomes p+-type;

depth D of the p+-type collector layers 10: 0.04 μm.

Figure 19A:
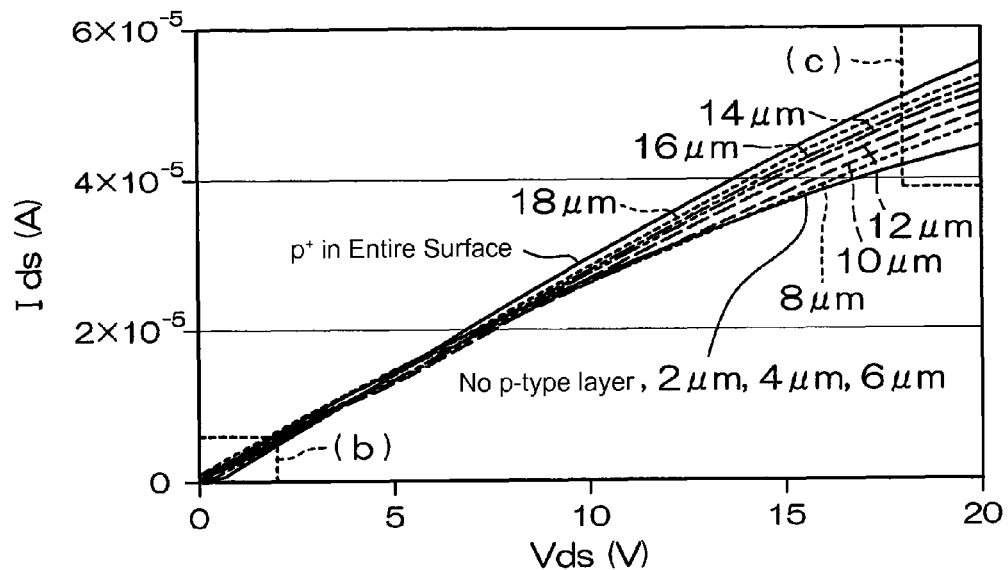
FIGS. 19A, 19B, and 19C are graphs that show Id-Vd characteristics of the semiconductor device for respective widths of the p⁺-type collector layer.
Figure 19B:
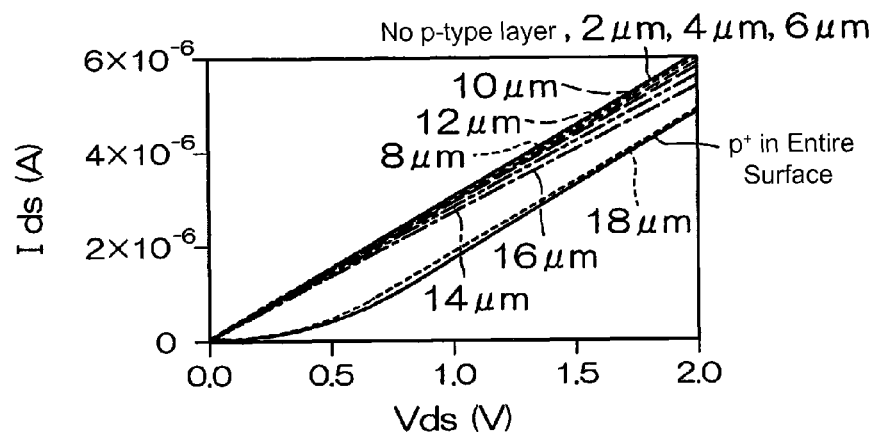
Figure 19C:
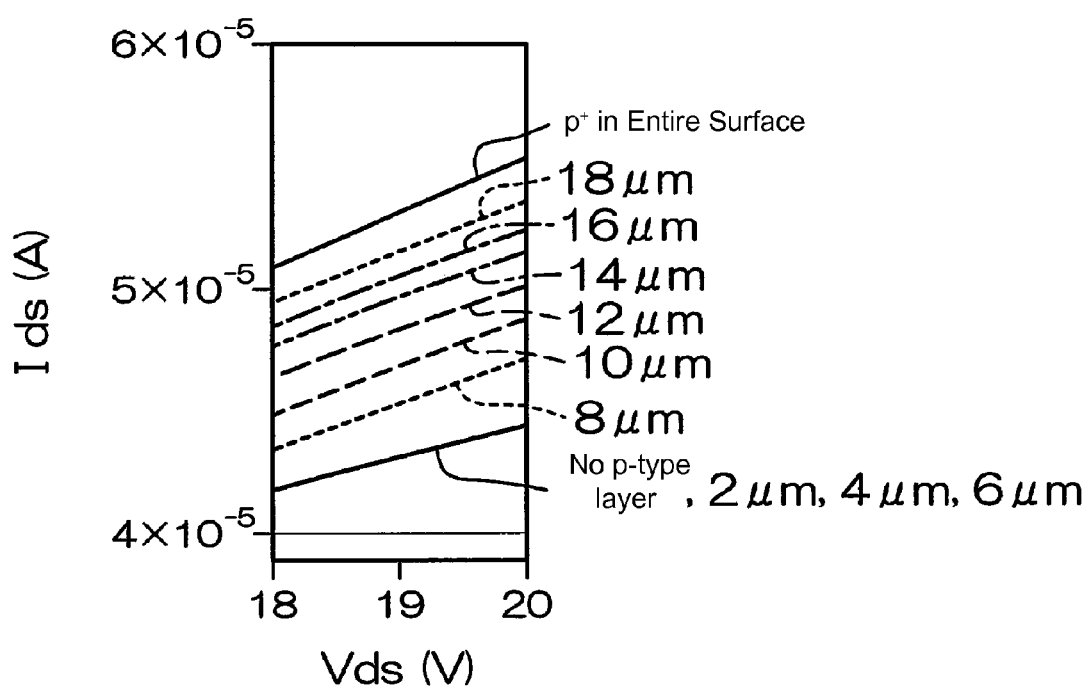

FIGS. 19A, 19B, and 19C show the Id-Vd characteristics for different widths W of the p+-type collector layers 10.

As shown in FIG. 19B, in the low voltage region from 0 to 2V, the ohmic characteristics are realized when the width W of the p+-type collector layers 10 is 16 μm or smaller. On the other hand, FIG. 19C shows that, in the high voltage region from 18 to 20V, the substantially same characteristics are realized when the width W of the p+-type collector layers 10 is 6 μm or smaller.

<Simulation 3>

Figure 20:
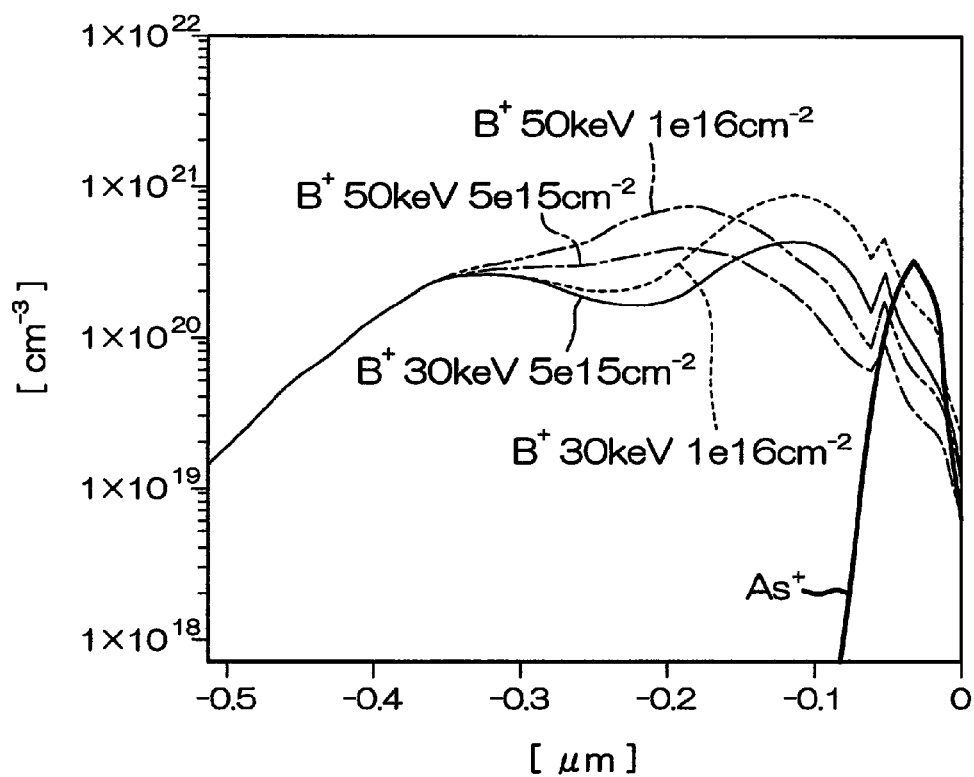
FIG. 20 is a concentration profile of arsenic (As) and boron (B) in the n⁻-type base layer in the depth direction.
Figure 21:
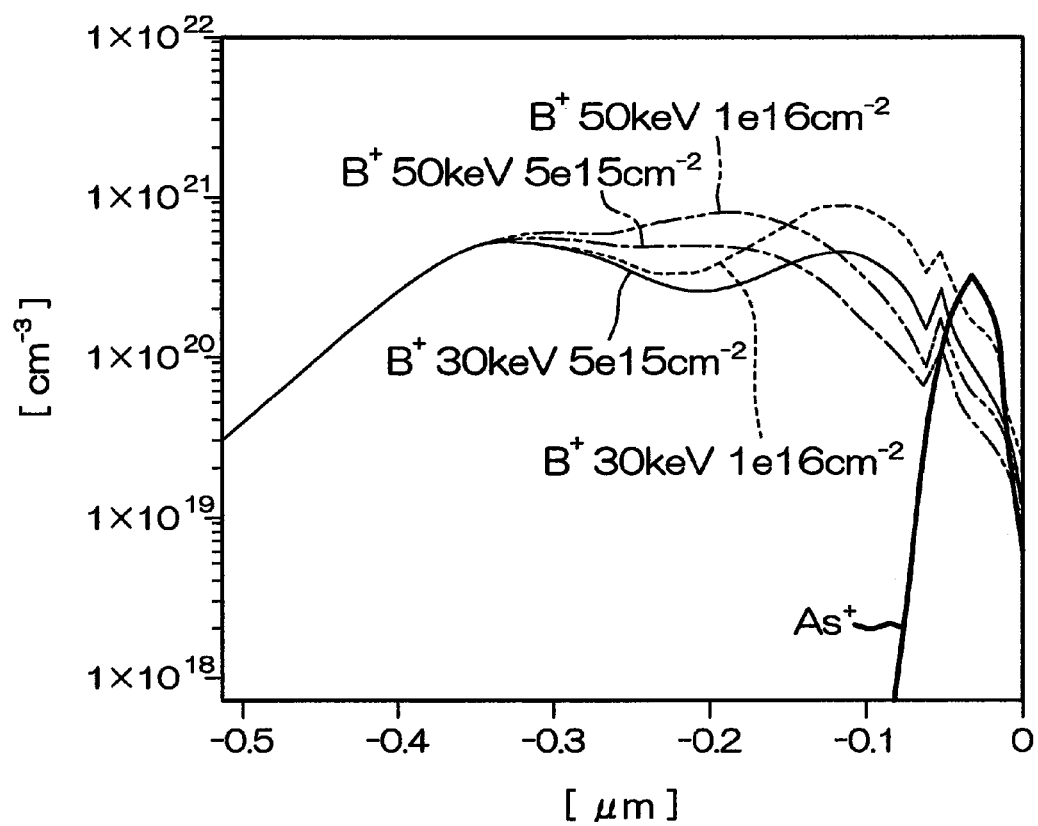
FIG. 21 is a concentration profile of arsenic (As) and boron (B) in the n⁻-type base layer in the depth direction.

Simulation 3 was conducted to verify the effect of injecting a p-type impurity twice in forming the p+-type collector layers 10. In Simulation 3, the conditions of respective semiconductor devices 1 were set as follows:

n−-type base layer 2: 5 Ω·cm, n+-type contact layer 9: As ion, 40 keV, 7 degrees, $1\times10^{15}$ cm$^{-2}$, ion implantation for the p+-type collector layers 10 (first time):
   B ion, 100 keV, 7 degrees, $5\times10^{15}$ cm$^{-2}$ (FIG. 20); and
   B ion, 100 keV, 7 degrees, $1\times10^{16}$ cm$^{-2}$ (FIGS. 21 and 22), ion implantation for the p+-type collector layers 10 (second time):
   B ion, 30 keV, 7 degrees, $5\times10^{15}$ cm$^{-2}$ (FIGS. 20 and 21);
   B ion, 30 keV, 7 degrees, $1\times10^{16}$ cm$^{-2}$ (FIGS. 20 and 21);
   B ion, 50 keV, 7 degrees, $5\times10^{15}$ cm$^{-2}$ (FIGS. 20 and 21);
   B ion, 50 keV, 7 degrees, $1\times10^{16}$ cm$^{-2}$ (FIGS. 20 and 21); and
   BF$_2$ ion, 30 keV, 7 degrees, $1\times10^{16}$ cm$^{-2}$ (FIG. 22).

Figure 22:
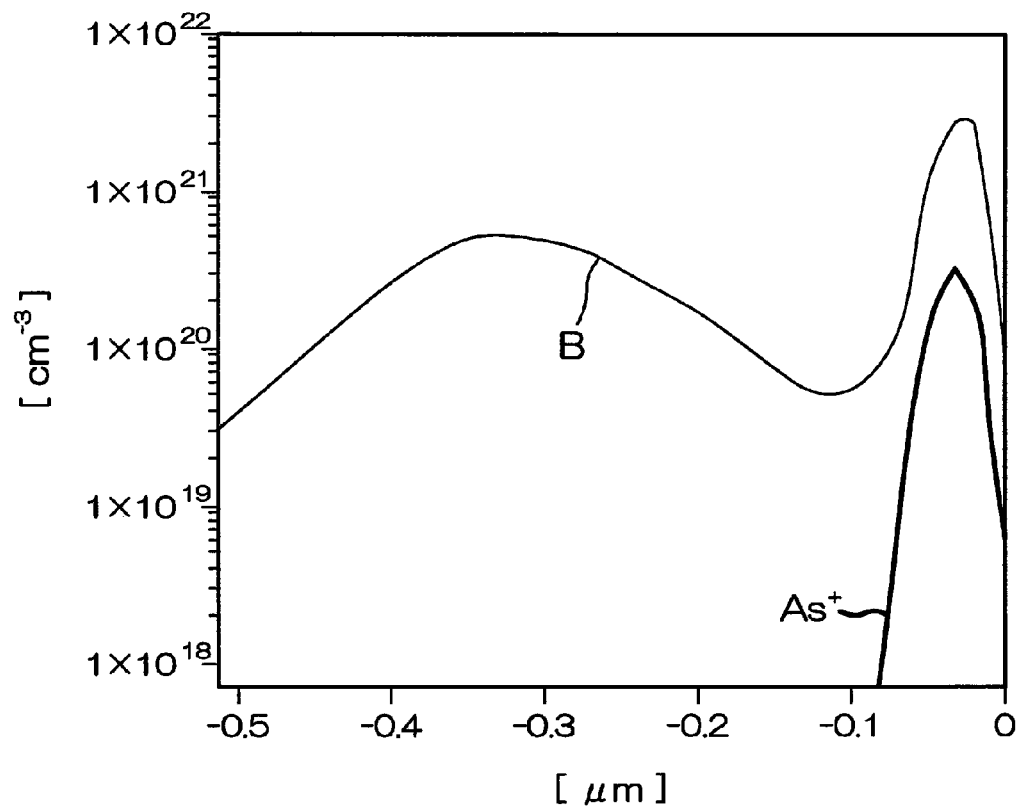
FIG. 22 is a concentration profile of arsenic (As) and boron (B) in the n⁻-type base layer in the depth direction.

The results are shown in FIGS. 20 to 22.

FIGS. 20 and 22 show that, in all of the cases above, the conductive type of the n+-type contact layer 9 near the rear surface 2a of the n−-type base layer 2 was cancelled, and the conductive type was inversed from n-type to p-type. Among them, as shown in FIG. 22, in the simulation of the two-step ion implantation process in which boron (B) and boron difluoride (BF$_2$) were implanted in this order, in the portions doped with the p-type impurities, the conductive type of the n+-type contact layer 9 was completely cancelled. This indicates that, by conducting a multiple implantation that includes BF$_2$ ion implantation, it is possible to achieve a greater margin than that shown in FIG. 22.

<Simulation 4>

Figure 23:
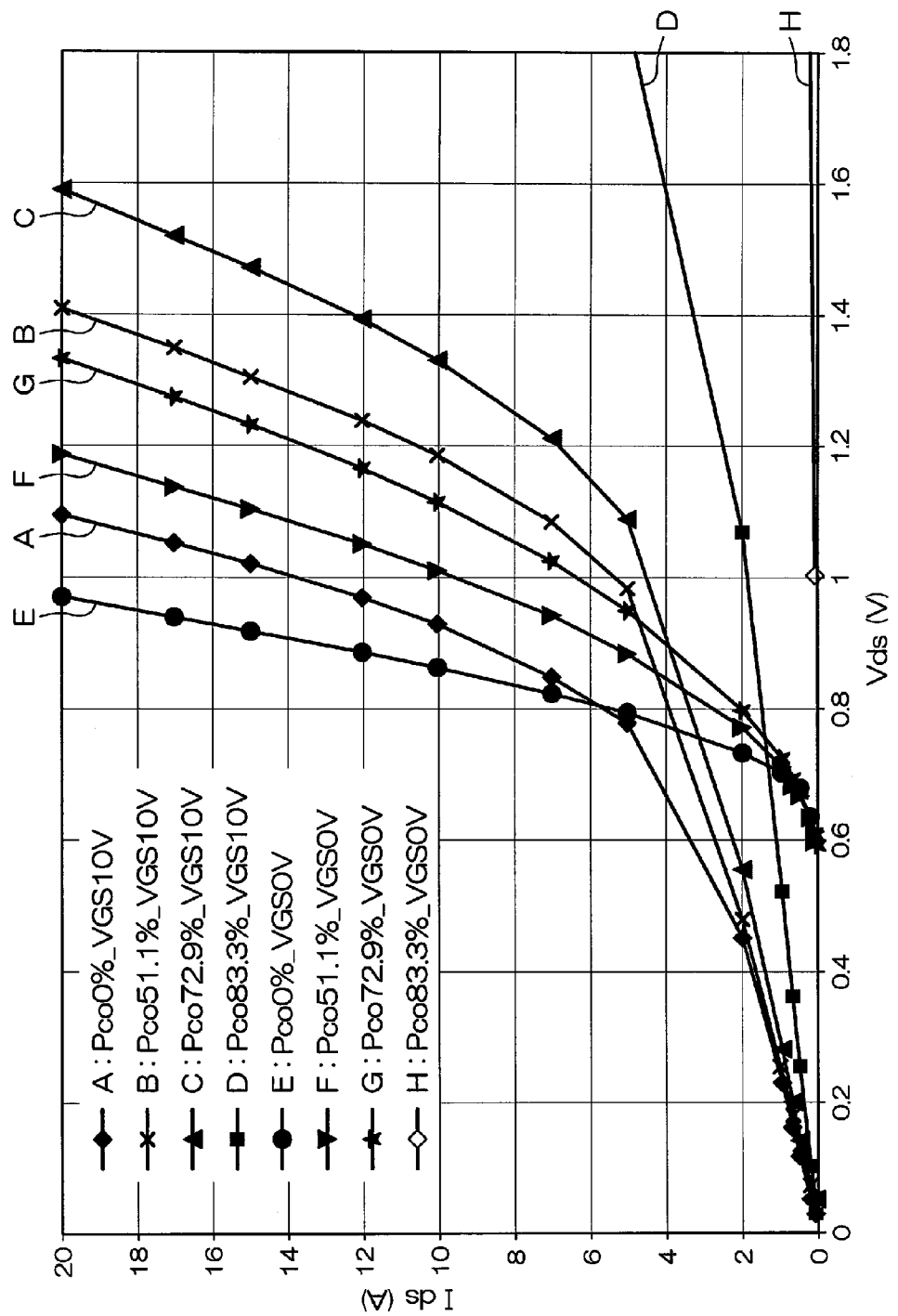
FIG. 23 is a graph showing Id-Vd characteristics of the semiconductor device and the parasitic diode.

Simulation 4 was conducted to obtain graphs to show whether the parasitic diode 14 contributes to a regenerative current. In this simulation, the inventors studied changes in the regenerative current flowing through the parasitic diode 14 depending on a proportion of the p+-type collector layers 10 in one pitch of the p+-type collector layers 10 (a distance between the respective centers of two adjacent p+-type collector layers 10). Four different patterns in which the proportions of the p+-type collector layers 10 are respectively 0% (no p+-type collector layer 10 is provided), 51.1%, 72.9%, and 83.3% were used. The Id-Vd characteristics of the parasitic diode 14 are shown in FIG. 23. In FIG. 23, graphs E to H are the Id-Vd characteristics of the parasitic diode 14, and graphs A to D are the Id-Vd characteristics (when the gate voltage is 10V) of the semiconductor device 1 (FET part).

As shown in the graphs E to H in FIG. 23, a regenerative current flowed through the parasitic diode 14 when the semiconductor device 1 is turned off (when the gate voltage is 0V).

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
    a first conductive type base layer;
    a second conductive type base layer formed in a part of a front surface portion of the first conductive type base layer;
    a first conductive type source layer formed in a part of a front surface portion of the second conductive type base layer;
    a gate insulating film formed on a front surface of the second conductive type base layer between the first conductive type source layer and the first conductive type base layer;
    a gate electrode formed on the gate insulating film so as to face, through the gate insulating film, the second conductive type base layer between the first conductive type source layer and the first conductive type base layer;
    a second conductive type column layer formed continuously from the second conductive type base layer within the first conductive type base layer, the second conductive type column layer extending from the second conductive type base layer toward a rear surface of the first conducive type base layer;
    a second conductive type collector layer formed in a part of a rear surface portion of the first conductive type base layer;
    a source electrode electrically connected to the first conductive type source layer; and
    a drain electrode formed so as to make contact with the rear surface of the first conductive type base layer, the drain electrode being electrically connected to the first conductive type base layer and the second conductive type collector layer.

2. The semiconductor device according to claim 1, wherein the first conductive type base layer comprises a first conductive type contact layer that is formed in the rear surface portion thereof, the first conductive type contact layer having a higher impurity concentration than that of other portions of the first conductive type base layer.

3. The semiconductor device according to claim 2, wherein the first conductive type base layer comprises: a drift layer that has a relatively low impurity concentration; and a substrate that supports the drift layer and that has a higher impurity concentration than that of the drift layer, and
    wherein the substrate serves as the first conductive type contact layer.

4. The semiconductor device according to claim 2, wherein the first conductive type contact layer is formed in the entire rear surface portion of the first conductive type base layer, and
    wherein the second conductive type collector layer is formed so as to penetrate the first conductive type contact layer in a thickness direction.

5. The semiconductor device according to claim 1, wherein a thickness of the first conductive type base layer between the rear surface thereof and a lower end of the second conductive type column layer is 30 μm or greater.

6. The semiconductor device according to claim 1, wherein a width of the second conductive type collector layer is greater than 6 μm and 16 μm or smaller.

7. The semiconductor device according to claim 1, wherein a depth of the second conductive type collector layer from the rear surface of the first conductive type base layer is 0.2 μm to 3.0 μm.

8. The semiconductor device according to claim 1, wherein an impurity concentration of the second conductive type collector layer is $1\times10^{17}$ cm$^{-3}$ to $1\times10^{22}$ cm$^{-3}$.

9. The semiconductor device according to claim 1, wherein the second conductive type collector layer is formed along the rear surface of the first conductive type base layer so as not to be directly below the second conductive type column layer.

10. The semiconductor device according to claim 9, wherein the second conductive type collector layer is located directly below the gate electrode.

11. The semiconductor device according to claim 1, wherein the second conductive type collector layer is located directly below the second conductive type column layer.

12. The semiconductor device according to claim 1, wherein a plurality of said second conductive type column layers, each of which is formed in a columnar shape, are provided and arranged in a staggered pattern in a plan view.

13. The semiconductor device according to claim 12, wherein the respective second conductive type column layers are formed in a quadrangular column shape in a plan view.

14. The semiconductor device according to claim 12, wherein the respective second conductive type column layers are formed in a hexagonal column shape in a plan view.

15. The semiconductor device according to claim 1, wherein a plurality of said second conductive type column layers, each of which is formed in a strip, are provided and arranged in a stripe pattern in a plan view.

16. The semiconductor device according to claim 1, wherein the gate insulating film is formed so as to cover a front surface of the first conductive type base layer, and the gate electrode is formed on the gate insulating film, thereby forming a planar gate structure.

17. The semiconductor device according to claim 1, wherein a gate trench is formed on a front surface side of the first conductive type base layer so as to penetrate the first conductive type source layer and the second conductive type base layer, and the gate electrode fills the gate trench with the gate insulating film interposed therebetween, thereby forming a trench gate structure.

18. The semiconductor device according to claim 1, wherein the second conductive type collector layer has a tapered shape that becomes narrower in a direction from a front surface of the first conductive type base layer toward the rear surface thereof.

19. The semiconductor device according to claim 1, wherein an impurity concentration of the second conductive type collector layer is made uniform in a direction along the rear surface of the first conductive type base layer.

20. The semiconductor device according to claim 1, wherein an impurity concentration of the second conductive type collector layer is made uniform in a direction orthogonal to the rear surface of the first conductive type base layer.

21. The semiconductor device according to claim 1, wherein an impurity concentration of the second conductive type collector layer changes in a direction along the rear surface of the first conductive type base layer.

22. The semiconductor device according to claim 1, wherein an impurity concentration of the second conductive type collector layer changes in a direction orthogonal to the rear surface of the first conductive type base layer.

23. The semiconductor device according to claim 1, wherein the first conductive type base layer has a depletion layer stopper region that includes first heavy particles, which were turned into donors, the depletion layer stopper region being disposed between the second conductive type column layer and the second conductive type collector layer.

24. The semiconductor device according to claim 1, wherein the first conductive type base layer has a trap level region that includes second heavy particles that form trap levels.

25. The semiconductor device according to claim 1, wherein the first conductive type base layer has a depletion layer stopper region that includes first heavy particles, which were turned into donors, the depletion layer stopper region being disposed between the second conductive type column layer and the second conductive type collector layer, and
wherein the first conductive type base layer further has a trap level region that includes second heavy particles that form trap levels.

26. The semiconductor device according to claim 25, wherein the depletion layer stopper region is made thicker than the trap level region.

27. The semiconductor device according to claim 24, wherein the second heavy particles include one of protons, $^3He^{++}$, and $^4He^{++}$.

28. The semiconductor device according to claim 23, wherein the first heavy particles include one of protons, $^3He^{++}$, and $^4He^{++}$.

* * * * *